(12) United States Patent
Andrews

(10) Patent No.: US 11,437,548 B2
(45) Date of Patent: *Sep. 6, 2022

(54) PIXELATED-LED CHIPS WITH INTER-PIXEL UNDERFILL MATERIALS, AND FABRICATION METHODS

(71) Applicant: CREELED, INC., Durham, NC (US)

(72) Inventor: Peter Scott Andrews, Durham, NC (US)

(73) Assignee: CREELED, INC., Durham, NC (US)

( * ) Notice: Subject to any disclaimer, the term of this patent is extended or adjusted under 35 U.S.C. 154(b) by 14 days.

This patent is subject to a terminal disclaimer.

(21) Appl. No.: 17/078,733

(22) Filed: Oct. 23, 2020

(65) Prior Publication Data

US 2022/0131048 A1 Apr. 28, 2022

(51) Int. Cl.
   *H01L 27/15* (2006.01)
   *H01L 29/18* (2006.01)
   (Continued)

(52) U.S. Cl.
   CPC .......... *H01L 33/486* (2013.01); *H01L 27/156* (2013.01); *H01L 33/005* (2013.01);
   (Continued)

(58) Field of Classification Search
   CPC . H01L 27/156; H01L 25/0753; H01L 33/007; H01L 33/62; H01L 33/32;
   (Continued)

(56) References Cited

U.S. PATENT DOCUMENTS

| 4,319,070 A | 3/1982 | Imai et al. |
| 5,955,747 A | 9/1999 | Ogihara et al. |

(Continued)

FOREIGN PATENT DOCUMENTS

| CN | 101894851 A | 11/2010 |
| EP | 2197051 A2 | 6/2010 |

(Continued)

OTHER PUBLICATIONS

Notice of Reasons for Refusal for Japanese Patent Application No. 2018-553935, dated Aug. 17, 2021, 8 pages.

(Continued)

*Primary Examiner* — Savitri Mulpuri
(74) *Attorney, Agent, or Firm* — Withrow & Terranova, P.L.L.C; Vincent K. Gustafson

(57) ABSTRACT

Pixelated-LED chips including a plurality of independently electrically accessible active layer portions supported by a plurality of discontinuous substrate portions to form a plurality of pixels, with underfill material of varying composition provided between sidewalls of adjacent pixels. Underfill materials having different reflection, scattering, absorption, filtering, etch-resistance, and/or light refraction properties may be provided in multiple layers. A method for fabricating a pixelated-LED chip includes defining streets through an active layer and portions of a substrate to form active layer portions, thinning an entire upper portion of a substrate to create openings into the streets and form discontinuous substrate portions bounding the streets, and supplying underfill material through the openings into the streets.

20 Claims, 12 Drawing Sheets

(51) Int. Cl.
*H01L 33/00* (2010.01)
*H01L 33/48* (2010.01)
*H01L 33/60* (2010.01)
*H01L 33/38* (2010.01)

(52) U.S. Cl.
CPC .............. *H01L 33/38* (2013.01); *H01L 33/60* (2013.01); *H01L 2933/0016* (2013.01)

(58) Field of Classification Search
CPC .............. H01L 33/44; H01L 2933/0016; H01L 2933/0091; H01L 33/22; H01L 33/20; H01L 2933/0025; H01L 2933/0066; H01L 33/0095; H01L 33/0093; H01L 33/08; H01L 33/486; H01L 33/005; H01L 33/38; H01L 33/60
See application file for complete search history.

(56) References Cited

U.S. PATENT DOCUMENTS

| | | |
|---|---|---|
| 6,160,354 A | 12/2000 | Ruvinskiy et al. |
| 6,657,236 B1 | 12/2003 | Thibeault et al. |
| 6,747,298 B2 | 6/2004 | Slater, Jr. et al. |
| 6,791,119 B2 | 9/2004 | Slater, Jr. et al. |
| 6,821,804 B2 | 11/2004 | Thibeault et al. |
| 6,888,167 B2 | 5/2005 | Slater, Jr. et al. |
| 7,211,803 B1 | 5/2007 | Dhurjaty et al. |
| 7,829,906 B2 | 11/2010 | Donofrio |
| 8,212,297 B1 | 7/2012 | Law et al. |
| 8,716,724 B2 | 5/2014 | von Malm et al. |
| 8,835,959 B2 | 9/2014 | Nakamura et al. |
| 8,940,561 B2 | 1/2015 | Donofrio et al. |
| 8,963,121 B2 | 2/2015 | Odnoblyudov et al. |
| 8,969,897 B2 | 3/2015 | Choi |
| 8,981,395 B2 | 3/2015 | Choi et al. |
| 9,048,368 B2 | 6/2015 | Jeong |
| 9,099,575 B2 | 8/2015 | Medendorp, Jr. et al. |
| 9,123,864 B2 | 9/2015 | Tomonari et al. |
| 9,129,977 B2 | 9/2015 | Marchand et al. |
| 9,130,127 B2 | 9/2015 | Katsuno et al. |
| 9,130,128 B2 | 9/2015 | Shinohara |
| 9,130,137 B2 | 9/2015 | Lin et al. |
| 9,136,432 B2 | 9/2015 | Yun et al. |
| 9,136,433 B2 | 9/2015 | Park et al. |
| 9,142,725 B1 | 9/2015 | Suzuki |
| 9,153,750 B2 | 10/2015 | Seo et al. |
| 9,159,894 B2 | 10/2015 | Cho et al. |
| 9,166,107 B2 | 10/2015 | Park |
| 9,166,108 B2 | 10/2015 | Unosawa |
| 9,166,110 B2 | 10/2015 | Aihara |
| 9,166,111 B2 | 10/2015 | Matsui et al. |
| 9,171,882 B2 | 10/2015 | Akimoto et al. |
| 9,172,002 B2 | 10/2015 | Wang et al. |
| 9,172,021 B2 | 10/2015 | Sugizaki et al. |
| 9,178,121 B2 | 11/2015 | Edmond et al. |
| 9,196,653 B2 | 11/2015 | Leatherdale et al. |
| 9,209,223 B2 | 12/2015 | Lee et al. |
| 9,219,196 B2 | 12/2015 | Seo et al. |
| 9,219,200 B2 | 12/2015 | Erchak et al. |
| 9,231,037 B2 | 1/2016 | Shimayama |
| 9,236,526 B2 | 1/2016 | Choi et al. |
| 9,240,433 B2 | 1/2016 | Kim et al. |
| 9,252,345 B2 | 2/2016 | Cho et al. |
| 9,263,643 B2 | 2/2016 | Huang et al. |
| 9,263,652 B2 | 2/2016 | Yoon et al. |
| 9,269,858 B2 | 2/2016 | Schubert et al. |
| 9,277,618 B2 | 3/2016 | Odnoblyudov et al. |
| 9,281,448 B2 | 3/2016 | Choi et al. |
| 9,281,449 B2 | 3/2016 | Kim et al. |
| 9,287,457 B2 | 3/2016 | Jeong et al. |
| 9,293,664 B2 | 3/2016 | Seo et al. |
| 9,293,674 B2 | 3/2016 | Kususe et al. |
| 9,293,675 B2 | 3/2016 | Yang et al. |
| 9,299,889 B2 | 3/2016 | Katsuno et al. |
| 9,299,893 B2 | 3/2016 | Chen et al. |
| 9,300,111 B2 | 3/2016 | Lee et al. |
| 9,318,529 B2 | 4/2016 | Jang et al. |
| 9,324,765 B2 | 4/2016 | An |
| 9,337,175 B2 | 5/2016 | Seo et al. |
| 9,362,335 B2 | 6/2016 | von Malm |
| 9,362,337 B1 | 6/2016 | Wu et al. |
| 9,373,756 B2 | 6/2016 | Lee et al. |
| 9,653,643 B2 | 5/2017 | Bergmann et al. |
| 9,729,676 B2 | 8/2017 | Kobayashi et al. |
| 9,748,309 B2 | 8/2017 | von Malm |
| 9,754,926 B2 | 9/2017 | Donofrio et al. |
| 9,831,220 B2 | 11/2017 | Donofrio et al. |
| 10,317,787 B2 | 6/2019 | Graves et al. |
| 10,903,265 B2 | 1/2021 | Andrews et al. |
| 2003/0015959 A1 | 1/2003 | Tomoda et al. |
| 2005/0023550 A1 | 2/2005 | Eliashevich et al. |
| 2005/0253492 A1 | 11/2005 | Besshi et al. |
| 2006/0012588 A1 | 1/2006 | Shinohara |
| 2006/0281203 A1 | 12/2006 | Epler et al. |
| 2007/0001943 A1 | 1/2007 | Lee et al. |
| 2008/0179611 A1 | 7/2008 | Chitnis et al. |
| 2008/0211416 A1 | 9/2008 | Negley et al. |
| 2008/0290351 A1 | 11/2008 | Ajiki et al. |
| 2009/0179843 A1 | 7/2009 | Ackermann et al. |
| 2009/0241390 A1 | 10/2009 | Roberts |
| 2010/0015574 A1 | 1/2010 | Van der Zel et al. |
| 2010/0051785 A1 | 3/2010 | Dai et al. |
| 2010/0123386 A1 | 5/2010 | Chen |
| 2010/0163900 A1 | 7/2010 | Seo et al. |
| 2011/0049545 A1 | 3/2011 | Basin et al. |
| 2011/0084294 A1 | 4/2011 | Yao |
| 2011/0121732 A1 | 5/2011 | Tsutsumi |
| 2011/0220934 A1 | 9/2011 | Gotoda et al. |
| 2011/0291143 A1 | 12/2011 | Kim et al. |
| 2011/0294240 A1 | 12/2011 | Kim |
| 2011/0297979 A1 | 12/2011 | Diana et al. |
| 2012/0062135 A1 | 3/2012 | Tamaki et al. |
| 2012/0119237 A1 | 5/2012 | Leatherdale et al. |
| 2012/0205634 A1 | 8/2012 | Ikeda et al. |
| 2012/0236582 A1 | 9/2012 | Waragaya et al. |
| 2012/0268042 A1 | 10/2012 | Shiobara et al. |
| 2013/0264592 A1 | 10/2013 | Bergmann et al. |
| 2014/0070245 A1 | 3/2014 | Haberern et al. |
| 2014/0110730 A1 | 4/2014 | Lee et al. |
| 2014/0361321 A1 | 12/2014 | Saito et al. |
| 2015/0049502 A1 | 2/2015 | Brandl et al. |
| 2015/0207045 A1 | 7/2015 | Wada et al. |
| 2015/0228876 A1 | 8/2015 | Place et al. |
| 2015/0262978 A1 | 9/2015 | Shibata |
| 2015/0279902 A1 | 10/2015 | Von Malm et al. |
| 2015/0295009 A1 | 10/2015 | Wang et al. |
| 2015/0311407 A1 | 10/2015 | Gootz et al. |
| 2015/0340346 A1 | 11/2015 | Chu et al. |
| 2015/0380622 A1 | 12/2015 | Miyoshi et al. |
| 2016/0150614 A1 | 5/2016 | Randolph |
| 2016/0163916 A1 | 6/2016 | Ilievski et al. |
| 2016/0240516 A1 | 8/2016 | Chang |
| 2017/0062680 A1 | 3/2017 | Yoo et al. |
| 2017/0092820 A1 | 3/2017 | Kim et al. |
| 2017/0098746 A1 | 4/2017 | Bergmann et al. |
| 2017/0135177 A1 | 5/2017 | Wang et al. |
| 2017/0141280 A1 | 5/2017 | Zhong et al. |
| 2017/0148771 A1 | 5/2017 | Cha et al. |
| 2017/0207284 A1 | 7/2017 | Dykaar |
| 2017/0229431 A1 | 8/2017 | Bergmann et al. |
| 2017/0250164 A1 | 8/2017 | Takeya et al. |
| 2017/0271561 A1 | 9/2017 | Bergmann et al. |
| 2017/0287887 A1 | 10/2017 | Takeya et al. |
| 2017/0294417 A1 | 10/2017 | Edmond et al. |
| 2017/0294418 A1 | 10/2017 | Edmond et al. |
| 2017/0317251 A1 | 11/2017 | Sweegers et al. |
| 2017/0318636 A1 | 11/2017 | Kums |
| 2017/0358624 A1 | 12/2017 | Takeya et al. |
| 2018/0012949 A1 | 1/2018 | Takeya et al. |
| 2018/0076368 A1 | 3/2018 | Hussell |
| 2018/0145058 A1 | 5/2018 | Meitl et al. |
| 2018/0212108 A1 | 7/2018 | Leirer et al. |
| 2018/0359825 A1 | 12/2018 | Hussell |

(56) References Cited

U.S. PATENT DOCUMENTS

| | | | |
|---|---|---|---|
| 2019/0044040 | A1 | 2/2019 | Andrews |
| 2020/0144460 | A1 | 5/2020 | Onuma et al. |
| 2021/0151422 | A1 | 5/2021 | Iguchi et al. |

FOREIGN PATENT DOCUMENTS

| | | | |
|---|---|---|---|
| EP | 2296179 | A2 | 3/2011 |
| EP | 2320483 | A1 | 5/2011 |
| EP | 2325883 | A2 | 5/2011 |
| EP | 2393132 | A2 | 12/2011 |
| EP | 3076442 | A1 | 10/2016 |
| JP | 2006008956 | A | 1/2006 |
| JP | 2008262993 | A | 10/2008 |
| JP | 2010087292 | A | 4/2010 |
| JP | 2013106048 | A | 5/2013 |
| JP | 2013179197 | A | 9/2013 |
| JP | 5788046 | B2 | 9/2015 |
| JP | 2015201473 | A | 11/2015 |
| JP | 2016072379 | A | 5/2016 |
| JP | 2019016821 | A | 1/2019 |
| KR | 100652133 | A | 11/2006 |
| KR | 1020130086109 | B1 | 3/2015 |
| WO | 2005062905 | A2 | 7/2005 |
| WO | 2008062783 | A1 | 5/2008 |
| WO | 2015063077 | A1 | 5/2015 |
| WO | 2015135839 | A1 | 9/2015 |
| WO | 2016087542 | A1 | 6/2016 |
| WO | 2016188505 | A1 | 12/2016 |

OTHER PUBLICATIONS

Carey, Julian, "New LED architectures and phosphor technologies lower costs and boost quality (Magazine)," LEDs Magazine, accessed Feb. 17, 2017, http://www.ledsmagazine.com/articles/print/volume-11/issue-7/features/manufacturing/new-led-architectures-and-phosphor-technologies-lower-costs-and-boost-quality.html, published Sep. 4, 2014, PennWell Corporation, 7 pages.
Chong, Wing et al., "1700 pixels per inch (PPI) Passive-Matrix Micro-LED Display Powered by ASIC," IEEE Compound Semiconductor Integrated Circuit Symposium (CSICs), Oct. 19-22, 2014, IEEE, 4 pages.
Dodel, Dr. Kerstin et al., "Capital Markets Day 2015," HELLA KGaA Hueck & Co, Dec. 2, 2015, London, HELLA, pp. 1-89.
Herrnsdorf, Johannes et al., "Active-Matrix GaN Micro Light-Emitting Diode Display With Unprecedented Brightness," IEEE Transactions on Electron Devices, vol. 62, Issue 6, Jun. 2015, IEEE, pp. 1918-1925.
Jiang, H. X. et al., "Nitride micro-LEDs and beyond—a decade progress review," Optics Express, vol. 21, Issue S3, Apr. 22, 2013, OSA, 10 pages.
Non-Final Office Action for U.S. Appl. No. 15/401,240, dated May 26, 2017, 7 pages.
Non-Final Office Action for U.S. Appl. No. 15/401,240, dated Jan. 17, 2018, 8 pages.
Invitation to Pay Additional Fees and Partial Search Report for International Patent Application No. PCT/US2017/026163, dated Aug. 1, 2017, 23 pages.
International Search Report and Written Opinion for International Patent Application No. PCT/US2017/026163, dated Oct. 25, 2017, 30 pages.
Author Unknown, "MBI5026: 16-bit Constant Current LED Sink Driver," Datasheet, Version 1.0, Mar. 2004, Hsinchu, Taiwan, www.DatasheetCatalog.com, Macroblock, Inc., pp. 1-15.
Non-Final Office Action for U.S. Appl. No. 15/399,729, dated Jan. 24, 2018, 12 pages.
Final Office Action for U.S. Appl. No. 15/399,729, dated Jun. 28, 2018, 9 pages.
Final Office Action for U.S. Appl. No. 15/401,240, dated Jun. 26, 2018, 11 pages.

Official Letter for Taiwanese Patent Application No. 106112033, dated Aug. 27, 2018, 19 pages.
Notice of Allowance for U.S. Appl. No. 15/399,729, dated Oct. 23, 2018, 8 pages.
Notice of Allowance for U.S. Appl. No. 15/401,240, dated Oct. 25, 2018, 7 pages.
International Preliminary Report on Patentability for International Patent Application No. PCT/US2017/026163, dated Oct. 25, 2018, 20 pages.
Invitation to Pay Additional Fees and Partial Search Report for International Patent Application No. PCT/US2018/045102, dated Oct. 30, 2018, 14 pages.
Quayle Action for U.S. Appl. No. 15/896,805, mailed Jan. 10, 2019, 5 pages.
Non-Final Office Action for U.S. Appl. No. 15/621,731, dated Dec. 31, 2018, 43 pages.
International Search Report and Written Opinion for International Patent Application No. PCT/US2018/045102, dated Jan. 21, 2019, 23 pages.
Non-Final Office Action for U.S. Appl. No. 15/399,729, dated Mar. 27, 2019, 9 pages.
Notice of Allowance for U.S. Appl. No. 15/401,240, dated Apr. 1, 2019, 8 pages.
Final Office Action for U.S. Appl. No. 15/621,731, dated Jul. 11, 2019, 15 pages.
Non-Final Office Action for U.S. Appl. No. 16/053,980, dated Jun. 13, 2019, 7 pages.
Notice of Allowance for U.S. Appl. No. 15/896,805, dated Jun. 21, 2019, 8 pages.
Examination Report for European Patent Application No. 17721889.8, dated Apr. 26, 2019, 12 pages.
Non-Final Office Action for U.S. Appl. No. 16/414,162, dated Sep. 13, 2019, 11 pages.
Non-Final Office Action for U.S. Appl. No. 16/414,162, dated Dec. 23, 2019, 10 pages.
Final Office Action for U.S. Appl. No. 16/414,162, dated Jul. 15, 2020, 11 pages.
Notice of Allowance for U.S. Appl. No. 16/414,162, dated Sep. 23, 2020, 8 pages.
Advisory Action and AFCP 2.0 Decision for U.S. Appl. No. 15/621,731, dated Oct. 9, 2019, 4 pages.
Non-Final Office Action for U.S. Appl. No. 15/621,731, dated Dec. 30, 2019, 15 pages.
Non-Final Office Action for U.S. Appl. No. 15/621,731, dated Jul. 8, 2020, 15 pages.
Notice of Allowance for U.S. Appl. No. 16/053,980, dated Oct. 21, 2019, 9 pages.
Non-Final Office Action for U.S. Appl. No. 16/174,584, dated Oct. 21, 2019, 7 pages.
Notice of Allowance for U.S. Appl. No. 16/174,584, dated Mar. 23, 2020, 11 pages.
Notice of Allowance for U.S. Appl. No. 16/229,986, dated Sep. 24, 2020, 8 pages.
Quayle Action for U.S. Appl. No. 16/229,986, mailed May 29, 2020, 6 pages.
Examination Report for European Patent Application No. 17721889.8, dated Dec. 13, 2019, 5 pages.
International Preliminary Report on Patentability for International Patent Application No. PCT/US2018/045102, dated Feb. 13, 2020, 15 pages.
International Search Report and Written Opinion for International Patent Application No. PCT/IB2019/060455, dated Feb. 7, 2020, 17 pages.
Notice of Allowance for U.S. Appl. No. 17/008,544, dated Sep. 29, 2020, 8 pages.
Notice of Reasons for Refusal for Japanese Patent Application No. 2018-553935, dated Nov. 24, 2020, 6 pages.
Office Action for Korean Patent Application No. 10-2018-7032540, dated Oct. 21, 2020, 23 pages.
Final Office Action for U.S. Appl. No. 15/621,731, dated Mar. 15, 2021, 17 pages.
Examination Report for European Patent Application No. 18762420.0, dated Jan. 28, 2021, 4 pages.

(56) References Cited

OTHER PUBLICATIONS

International Search Report and Written Opinion for International Patent Application No. PCT/US2020/057955, dated Feb. 12, 2021, 18 pages.
Notice of Allowance for U.S. Appl. No. 16/950,142, dated Jan. 18, 2022, 9 pages.
Non-Final Office Action for U.S. Appl. No. 16/983,553, dated Nov. 24, 2021, 8 pages.
Notice of Reasons for Rejection for Japanese Patent Application No. 2018-553935, dated Jan. 5, 2022, 6 pages.
Office Action for Korean Patent Application No. 10-2021-7026409, dated Dec. 21, 2021, 4 pages.
Applicant-Initiated Interview Summary for U.S. Appl. No. 15/621,731, dated May 12, 2021, 2 pages.
Advisory Action for U.S. Appl. No. 15/621,731, dated May 28, 2021, 3 pages.
Notice of Allowance for U.S. Appl. No. 15/621,731, dated Jun. 18, 2021, 15 pages.
Examination Report for European Patent Application No. 17721889.8, dated Apr. 20, 2021, 7 pages.
Grant of Patent for Korean Patent Application No. 10-2018-7032540, dated May 21, 2021, 4 pages.
International Preliminary Report on Patentability for International Patent Application No. PCT/IB2019/060455, dated Jul. 1, 2021 10 pages.
Notice of Allowance for U.S. Appl. No. 16/983,553, dated Apr. 14, 2022, 9 pages.
Preliminary Examination Report for Taiwanese Patent Application No. 107127064, dated Mar. 10, 2022, 7 pages.
Invitation to Pay Additional Search Fees for European Patent Application No. 18762420.0, date Feb. 11, 2022, 4 pages.
Notice of Reasons for Rejection for Japanese Patent Application No. 2020-505841, dated Apr. 19, 2022, 9 pages.
Decision of Dismissal of Amendment for Japanese Patent Application No. 2018-553935, dated Apr. 26, 2022, 4 pages.
Decision of Refusal for Japanese Patent Application No. 2018-553935, dated Apr. 26, 2022, 2 pages.
Examination Report for European Patent Application No. 18762420.0, dated Apr. 19, 2022, 10 pages.

PIXELATED-LED CHIPS WITH INTER-PIXEL UNDERFILL MATERIALS, AND FABRICATION METHODS

TECHNICAL FIELD

Subject matter herein relates to solid state light-emitting devices, including light emitting diode (LED) array chips with reduced interaction between emissions of adjacent emitters, devices incorporating one or more LED array chips, as well as related fabrication methods.

BACKGROUND

Light emitting diodes (LEDs) are widely known solid-state lighting elements that are capable of generating light in response to an applied voltage. LEDs generally include a diode region having an n-type layer, a p-type layer and a p-n junction, with an anode and cathode contacting the p-type and n-type layers, respectively. The diode region may be epitaxially formed on a substrate, such as a sapphire, silicon, silicon carbide, gallium arsenide, gallium nitride, etc., growth substrate, but the completed device may or may not include a substrate. The diode region may be fabricated, for example, from silicon carbide, gallium nitride, gallium phosphide, aluminum nitride and/or gallium arsenide-based materials and/or from organic semiconductor-based materials.

LEDs have been widely adopted in various illumination contexts, for backlighting of liquid crystal display (LCD) systems (e.g., as a substitute for cold cathode fluorescent lamps), and for sequentially illuminated LED displays. Applications utilizing LED arrays include automotive headlamps, roadway illumination, light fixtures, and various indoor, outdoor, and specialty contexts. Desirable characteristics of LED devices according to various end uses include high luminous efficacy, long lifetime, and wide color gamut.

Conventional color LCD display systems require color filters (e.g., red, green, and blue) that inherently reduce light utilization efficiency. Sequential illuminated LED displays, which utilize self-emitting LEDs and dispense with the need for backlights and color filters, provide enhanced light utilization efficiency.

Large format multi-color sequentially illuminated LED displays (including full color LED video screens) typically include numerous individual LED panels, packages, and/or components providing image resolution determined by the distance between adjacent pixels or "pixel pitch." Sequentially illuminated LED displays may include "RGB" three-color displays with arrayed red, green and blue LEDs, or "RG" two-color displays with arrayed red and green LEDs. Other colors and combinations of colors may be used. Large format displays (e.g., electronic billboards and stadium displays) intended for viewing from great distances typically have relatively large pixel pitches and usually include discrete LED arrays with multi-color (e.g., red, green, and blue) LEDs that may be independently operated to form what appears to a viewer to be a full color pixel. Medium-sized displays with relatively shorter viewing distances require shorter pixel pitches (e.g., 3 mm or less), and may include panels with arrayed red, green, and blue LED components mounted on a single electronic device attached to a driver printed circuit board (PCB) that controls the LEDs.

Various LED array applications, including (but not limited to) automotive headlamps, high resolution displays suitable for short viewing distances, and other lighting devices, may benefit from smaller pixel pitches; however, practical considerations have limited their implementation. Conventional pick-and-place techniques useful for mounting LED components and packages to PCBs may be difficult to implement in a reliable manner in high-density arrays with small pixel pitches. Avoiding unsupported regions between and under LEDs within and between LED arrays may be challenging, particularly when distances between adjacent surfaces are small.

U.S. Patent Application Publication No. 2020/0203419 A1 of Cree, Inc. describes an embodiment in which a pixelated LED chips is mounted to a submount, openings registered with streets between pixels are defined by sawing through a substrate, and underfill material is supplied through the openings into areas between pixels as well as between anodes and cathodes. However, this sawing requires precise alignment with underlying streets, is time-consuming, and entails a risk of cracking the substrate.

Additionally, due to the omnidirectional character of LED and phosphor emissions, it may be challenging to prevent emissions of one LED (e.g., a first pixel) from significantly overlapping emissions of another LED (e.g., a second pixel) of an array, which would impair the effective resolution of an LED array device.

The art continues to seek improved LED array devices with small pixel pitches while overcoming limitations associated with conventional devices and production methods.

SUMMARY

The present disclosure relates in various aspects to pixelated-LED chips including a plurality of independently electrically accessible active layer portions supported by a plurality of discontinuous substrate portions to form a plurality of pixels, with underfill material of varying composition provided between sidewalls of adjacent pixels. Methods for fabricating pixelated-LED chips are further provided, including defining streets through an active layer and portions of a substrate to form active layer portions, thinning an entire upper portion of a substrate (e.g., by grinding) to create openings into the streets and form discontinuous substrate portions bounding the streets, and supplying underfill material through the openings into the streets.

In one aspect, the disclosure relates to a pixelated-LED chip that comprises: an active layer comprising a plurality of active layer portions; a substrate comprising a plurality of discontinuous substrate portions supporting the plurality of active layer portions, wherein each substrate portion comprises a light-transmissive material with a light extraction surface; and a plurality of anode-cathode pairs associated with the plurality of active layer portions. Each active layer portion of the plurality of active layer portions is configured to illuminate a different substrate portion of the plurality of discontinuous substrate portions and transmit light through the light extraction surface of the substrate portion, such that the plurality of active layer portions and the plurality of discontinuous substrate portions form a plurality of pixels. An underfill material is arranged (i) between lateral sidewalls of the plurality of pixels and (ii) between the anode and the cathode of each pixel of the plurality of pixels. Lateral sidewalls of plurality of pixels comprise a lower boundary proximate to the plurality of anode-cathode pairs, and comprise an upper boundary proximate to the light extraction surface of each substrate portion. The underfill material comprises a first composition proximate to the lower boundary, the underfill material comprises a second composition proximate to the upper boundary, and the second composition differs from the first composition.

In certain embodiments, the pixelated-LED chip comprises at least one of the following features: (i) the underfill material comprises a total thickness in a range of 15 µm to 200 µm; (ii) the first composition is provided in a first layer that comprises a first thickness, the second composition is provided in a second layer that comprises a second thickness, and a ratio of the first thickness to the second thickness is in a range of from 1:1 to 20:1; (iii) the first composition is provided in a first layer that comprises one of an optically reflective underfill layer, an optical scattering underfill layer, a light-absorptive underfill layer, a selectively light reflective underfill layer, a selectively light absorptive underfill layer, a light filtering underfill layer, or an etch-resistant underfill layer; and the second composition is provided in a second layer that comprises a different one of an optically reflective underfill layer, an optical scattering underfill layer, a light-absorptive underfill layer, a selectively light reflective underfill layer, a selectively light absorptive underfill layer, a light filtering underfill layer, or an etch-resistant underfill layer; or (iv) the underfill material comprises particulate material and a binder present in a weight percent ratio of particulate material to binder in a range of from 1:1 to 10:1.

In certain embodiments, the underfill material comprises silicone and a metallic oxide.

In certain embodiments, the second composition comprises a greater concentration of metallic oxide than the first composition.

In certain embodiments, the second composition comprises silica, and the second composition comprises a greater concentration of silica than the first composition. Silica may be provided in forms such as fumed silica, fused silica, or glass spheres, among others.

In certain embodiments, a pixelated-LED chip comprises a gradient transition of material composition between (i) the first composition proximate to the lower boundary and (ii) the second composition proximate to the upper boundary.

In certain embodiments, the plurality of substrate portions comprises silicon carbide or sapphire, and the plurality of active layer portions comprises at least one Group III nitride material.

In certain embodiments, the pixelated-LED chip is arranged in a flip-chip configuration, with the active layer arranged between the substrate and the at least one anode-cathode pair.

In certain embodiments, the pixelated-LED chip further comprises at least one lumiphoric material arranged on or over the light extraction surface and in contact with the underfill material, wherein the at least one lumiphoric material is configured to receive at least a portion of light emitted by the plurality of active layer portions and to responsively generate lumiphor emissions In certain embodiments, the at least one lumiphoric material is continuous on the plurality of pixels.

In certain embodiments, the at least one lumiphoric material comprises a thickness variation of less than 500 nm over an entirety of the light extraction surface.

In certain embodiments, the light extraction surface is microtextured.

In certain embodiments, the light extraction surface comprises a non-repeating irregular textural pattern.

In another aspect, the disclosure relates to a pixelated-LED chip that comprises: an active layer comprising a plurality of active layer portions; a substrate comprising a plurality of discontinuous substrate portions supporting the plurality of active layer portions, wherein each substrate portion comprises a light-transmissive material with a light extraction surface; and a plurality of anode-cathode pairs associated with the plurality of active layer portions. Each active layer portion of the plurality of active layer portions is configured to illuminate a different substrate portion of the plurality of discontinuous substrate portions and transmit light through the light extraction surface of the substrate portion, such that the plurality of active layer portions and the plurality of discontinuous substrate portions form a plurality of pixels. A plurality of underfill material layers is arranged (i) between lateral sidewalls of the plurality of pixels and (ii) between the anode and the cathode of each pixel of the plurality of pixels, with each underfill material layer of the plurality of underfill material layers being compositionally different relative to each adjacent underfill material layer of the plurality of underfill material layers.

In certain embodiments, a first underfill material layer of the plurality of underfill material layers comprises one of an optically reflective underfill layer, an optical scattering underfill layer, a light-absorptive underfill layer, a selectively light reflective underfill layer, a selectively light absorptive underfill layer, a light filtering underfill layer, or an etch-resistant underfill layer; and a second underfill material layer of the plurality of underfill material layers comprises a different one of an optically reflective underfill layer, an optical scattering underfill layer, a light-absorptive underfill layer, a selectively light reflective underfill layer, a selectively light absorptive underfill layer, a light filtering underfill layer, or an etch-resistant underfill layer.

In certain embodiments, a pixelated-LED chip comprises at least one of the following features: (i) the plurality of underfill material layers comprises a total thickness in a range of 15 µm to 200 µm; (ii) the plurality of underfill material layers comprises a first underfill material layer and a second underfill material layer, and a ratio of the first thickness to the second thickness is in a range of from 1:1 to 20:1; and (iii) the plurality of underfill material layers comprises a first underfill material layer and a second underfill material layer, and each of the first and the second underfill material layers comprises particulate material and a binder present in a weight percent ratio of particulate material to binder in a range of from 1:1 to 10:1.

In certain embodiments, one or more underfill material layers of the plurality of underfill material layers comprises silicone and at least one metallic oxide.

In certain embodiments, one underfill material layer of the plurality of underfill material layers comprises a greater concentration of metallic oxide than another underfill material layer of the plurality of underfill material layers.

In certain embodiments, one underfill material layer of the plurality of underfill material layers comprises a greater concentration of silica (e.g., fumed silica in certain embodiments) than another underfill material layer of the plurality of underfill material layers.

In certain embodiments, the pixelated-LED chip further comprises at least one lumiphoric material arranged on or over the light extraction surface and in contact with the underfill material, wherein the at least one lumiphoric material is configured to receive at least a portion of light emitted by the plurality of active layer portions and to responsively generate lumiphor emissions.

In certain embodiments, the at least one lumiphoric material is continuous on the plurality of pixels.

In certain embodiments, the at least one lumiphoric material comprises a thickness variation of less than 500 nm over an entirety of the light extraction surface.

In certain embodiments, the light extraction surface comprises a non-repeating irregular textural pattern.

In another aspect, the disclosure relates to a method for fabricating a pixelated-LED chip. The method comprises: defining a plurality of streets through a subassembly comprising an active layer supported by a substrate, wherein the plurality of streets extend through an entire thickness of the active layer to form a plurality of active layer portions, and the plurality of streets extend into, but through less than an entire thickness of, the substrate; providing a plurality of anode-cathode pairs in electrical communication with the plurality of active layer portions, wherein the plurality of active layer portions is arranged between the plurality of anode-cathode pairs and the substrate; thinning the substrate by surface grinding to create openings into the plurality of streets and form a plurality of discontinuous substrate portions bounding the plurality of streets, wherein each substrate portion of the plurality of discontinuous substrate portions comprises an outer substrate surface that serves as a light extraction surface, and wherein the plurality of active layer portions and the plurality of discontinuous substrate portions form a plurality of pixels; and supplying an underfill material in flowable form through the openings into the plurality of streets.

In certain embodiments, upon completion of the supplying of underfill material, the underfill material is arranged (i) between lateral sidewalls of the plurality of pixels and (ii) between the anode and the cathode of each pixel of the plurality of pixels.

In certain embodiments, lateral sidewalls of plurality of pixels comprise a lower boundary proximate to the plurality of anode-cathode pairs, and comprise an upper boundary proximate to the light extraction surface of each substrate portion; and the underfill material comprises a first composition proximate to the lower boundary, the underfill material comprises a second composition proximate to the upper boundary, and the second composition differs from the first composition.

In certain embodiments, the underfill material comprises a mixture of silicone and at least one metallic oxide.

In certain embodiments, the method further comprises, after the supplying of underfill material, wiping the pixelated-LED chip according to a first wiping step to remove underfill material from (i) the outer substrate surface of the plurality of discontinuous substrate portions and (2) portions of the plurality of streets.

In certain embodiments, the method further comprising supplying particulate material in dry form to the plurality of streets after the first wiping step, followed by performing a second wiping step to remove excess particulate material from the plurality of streets. In certain embodiments, the particulate material comprises at least one metallic oxide.

In certain embodiments, the method further comprises supplying underfill material in flowable form to the plurality of streets after the second wiping step, followed by performing a third wiping step to remove excess underfill material.

In certain embodiments, the method further comprises supplying additional particulate material in dry form to the plurality of streets after the third wiping step, followed by performing a fourth wiping step to remove excess particulate material from the plurality of streets. In certain embodiments, the additional particulate material comprises at least one of a metallic oxide or silica.

In certain embodiments, the method further comprises subjecting the plurality of pixels and the underfill material to an elevated pressure condition in a pressure vessel, followed by controlled release of pressure from the pressure vessel. In certain embodiments, the method additional comprises subjecting the plurality of pixels and the underfill material to a subatmospheric pressure condition in a vacuum chamber, followed by controlled admission of gas into the vacuum chamber.

In certain embodiments, the method further comprises curing the underfill material.

In certain embodiments, the method further comprises removing a portion of the underfill material following the curing step. In certain embodiments, the method further comprises removing a portion of the underfill material following the curing step.

In certain embodiments, the method further comprises supplying additional underfill to a gap in cured underfill material following the removing of a portion of the underfill material.

In certain embodiments, the method further comprises applying at least one lumiphoric material arranged on or over the light extraction surface and in contact with the underfill material, wherein the at least one lumiphoric material is configured to receive at least a portion of light emitted by the plurality of active layer portions and to responsively generate lumiphor emissions.

In certain embodiments, the method further comprises mounting the pixelated-LED chip over a mounting surface prior to the thinning of the substrate.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

Figure 1:
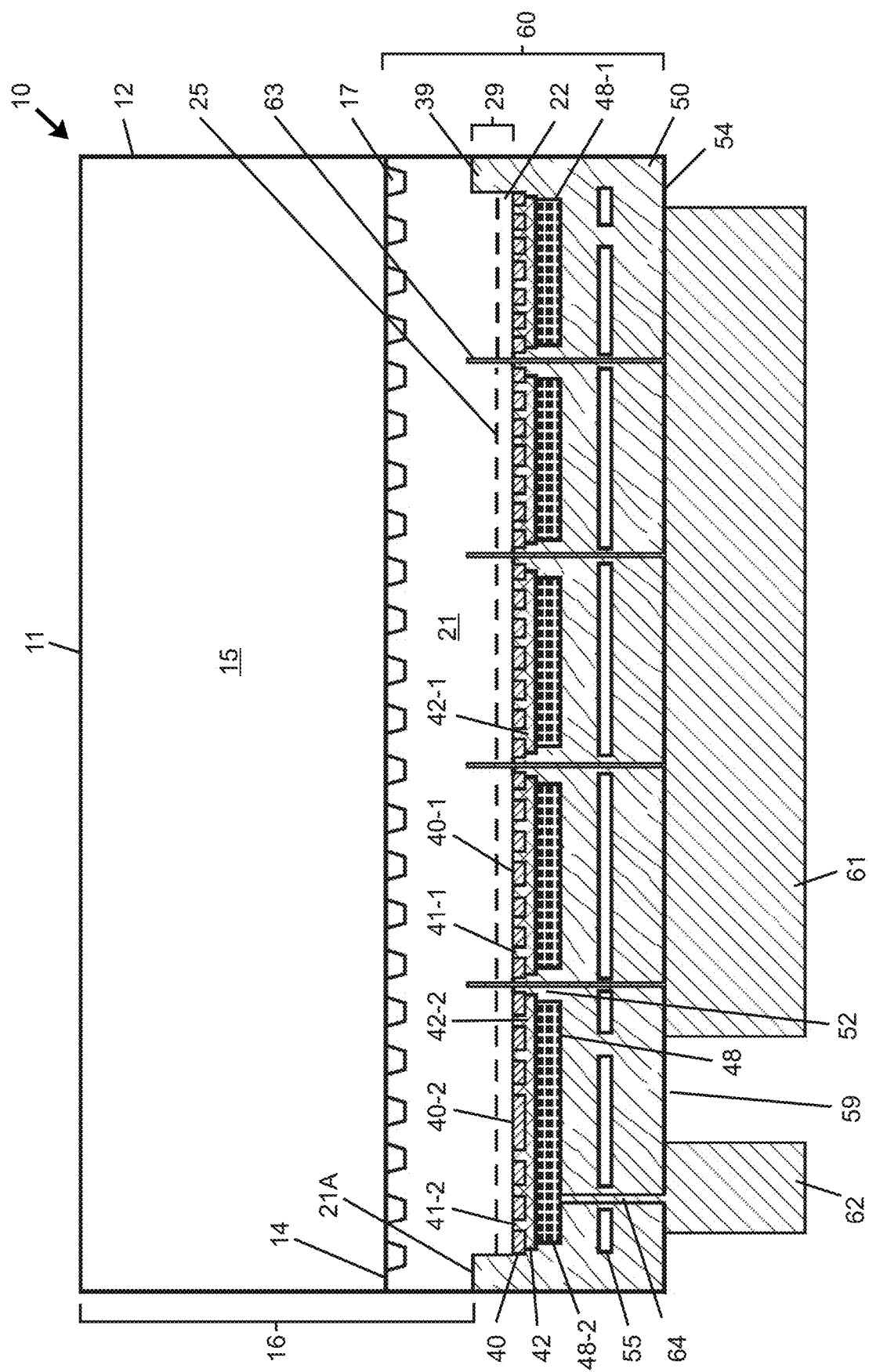
FIG. 1 is a side cross-sectional illustration of a flip chip light emitting diode (LED) being representative of flip chips useable in flip chip LED arrays according to embodiments of the present disclosure.

Disclosed herein are pixelated-LED chips including inter-pixel underfill materials, and associated fabrication methods. A pixelated-LED chip includes a plurality of independently electrically accessible active layer portions supported by a plurality of discontinuous substrate portions to form a plurality of pixels. Underfill material is provided between sidewalls of adjacent pixels, and between anodes and cathodes of the LED chip. A composition of the underfill material may vary with depth between sidewalls of adjacent pixels, such as to provide layers of different underfill compositions. Methods for fabricating pixelated-LED chips are further provided, including defining streets through an active layer and portions of a substrate to form active layer portions, thinning an entire upper region of a substrate (e.g., by grinding) to create openings into the streets and form discontinuous substrate portions bounding the streets, and supplying underfill material through the openings into the streets. The streets may be defined by deep chemical etching. By forming deep streets and then thinning an entire upper portion of a substrate, discontinuous substrate portions with openings into the streets may be formed, without a need for sawing trenches through a substrate registered with underlying streets. The resulting openings are suitable for receiving underfill material. By supplying underfill material through openings into multiple streets of a pixelated-LED chip, challenges associated with supplying underfill material by lateral wicking are avoided. A reduction or elimination of holes or voids in the underfill material provides enhanced mechanical support for pixels of an array. When the underfill material provides light segregation utility, a reduction in holes or voids in underfill material between pixels provides uniform contrast among pixels of one or more pixelated-LED chips. Varying concentration of particulate material with depth between sidewalls of adjacent pixels (e.g., with a higher concentration of particulate material proximate to an upper boundary of lateral sidewalls of pixels) may also serve to enhance contrast between adjacent pixels of one or more pixelated-LED chips.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

As used herein, a "pixelated-LED chip" refers to an inorganic light emitting device or precursor thereof, in which a body or film comprising at least one layer or region made of a semiconductor material and being configured into sub-regions or pixels to emit visible light, infrared and/or ultraviolet light when a current is applied. The pixelated-LED chip may include an active layer that is segregated into a plurality of active layer portions such that each pixel comprises a different active layer portion. The pixelated-LED chip may also include a substrate that supports the active layer. The substrate may be segregated, entirely through a thickness of the substrate, into a plurality of discontinuous substrate portions that support a different active layer portion in each pixel. Depending on the embodiment, the pixelated-LED chip may include lumiphoric materials, including phosphors or other conversion materials, and other physical optical structures that are integral with the pixelated-LED chip.

As used herein, an "active layer" or an "active region" of a solid state light emitting device refers to the layer or region in which majority and minority electronic carriers (e.g., holes and electrons) recombine to produce light. In general, an active layer or region according to embodiments disclosed herein can include a double heterostructure or a well structure, such as a quantum well structure. An active layer or region can include multiple layers or regions, such as a multiple quantum well structure.

Solid state light emitting devices disclosed herein may include at least one solid state light source (e.g., an LED chip or a pixelated-LED chip) and one or more lumiphoric materials (also referred to herein as lumiphors) arranged to receive emissions of the at least one solid state light source. A lumiphoric material may include one or more of a phosphor, a scintillator, a lumiphoric ink, a quantum dot material, a day glow tape, or the like. In certain embodiments, a lumiphoric material may be in the form of one or more phosphors and/or quantum dots arranged in a binder such as silicone or glass, arranged in the form of a single crystalline plate or layer, a polycrystalline plate or layer, and/or a sintered plate. In certain embodiments, a lumiphoric material such as a phosphor may be spin coated or sprayed on a surface of an LED array or a pixelated-LED chip. In certain embodiments, a lumiphoric material composition may be dispensed or otherwise applied in fluid form (e.g., akin to a gel, such as with lumiphoric material particles dispersed in silicone or another binding material) on or over a light extraction surface, and then leveling the lumiphoric material composition by skimming a surface thereof with a flat edge such as a squeegee, followed by curing and solidification of any binding material. In certain embodiments, a lumiphoric material may be located on a growth substrate, on epitaxial layers, and/or on a carrier substrate of an LED array or a pixelated-LED chip. If desired, multiple pixels including one or more lumiphoric materials may be manufactured in a single plate. In general, a solid state light source may generate light having a first peak wavelength. At least one lumiphor receiving at least a portion of the light generated by the solid state light source may re-emit light having a second peak wavelength that is different from the first peak wavelength. A solid state light source and one or more lumiphoric materials may be selected such that their combined output results in light with one or more desired characteristics such as color, color point, intensity, etc. In certain embodiments, aggregate emissions of one or more flip chip LEDs or pixels of a pixelated-LED chip, optionally in combination with one or more lumiphoric materials, may be arranged to provide cool white, neutral white, or warm white light, such as within a color temperature range of from 2500 K to 10,000 K. In certain embodiments, lumiphoric materials having cyan, green, amber, yellow, orange, and/or red peak wavelengths may be used. In certain embodiments, lumiphoric materials may be added to one or more emitting surfaces (e.g., a top surface and one or more edge surfaces) by methods such as spray coating, dipping, liquid dispensation, powder coating, inkjet printing, or the like. In certain embodiments, lumiphoric material may be dispersed in an encapsulant, adhesive, or other binding medium.

In certain embodiments, photolithographic patterning or other stencil-type patterning may be used to permit different lumiphoric materials to be applied on or over different pixels associated with a substrate to provide lumiphoric materials and/or scattering materials that differs in (a) composition, (b) concentration, (c) particle size, or (d) distribution with respect to different pixels.

In certain embodiments, a scattering material may be provided between a substrate and a lumiphoric material, or may be incorporated into a lumiphoric material. The scattering material may include scattering particles arranged in a binder, such as silicone. The scattering particles affect total internal reflection (TIR) of light to promote scattering and mixing of light that interacts with the scattering material. The scattering particles may include fused silica, fumed silica, or particles of titanium dioxide ($TiO_2$), among others. In some embodiments, the scattering material includes a layer of scattering particles suspended in a binder that is applied on the lumiphoric material. In other embodiments, the scattering particles may be included within the lumiphoric material such that the lumiphoric material comprises lumiphoric particles and scattering particles suspended in the same binder.

As used herein, a layer or region of a light emitting device may be considered to be "transparent" when at least 70% of emitted radiation that impinges on the layer or region emerges through the layer or region. For example, in the context of LEDs configured to emit visible light, suitably pure crystalline substrate materials of silicon carbide (SiC) or sapphire may be considered transparent. Moreover, as used herein, a layer or region of an LED is considered to be "reflective" or embody a "reflector" when at least 70% of the angle averaged emitted radiation that impinges on the layer or region is reflected. In some embodiments, an LED is considered to be "reflective" or embody a "reflector" when at least 90% of the angle averaged emitted radiation that impinges on the layer or region is reflected. For example, in the context of gallium nitride (GaN)-based blue and/or green LEDs, silver (Ag) (for example, at least 70% reflective, or at least 90% reflective) may be considered a reflective or reflecting material. In the case of ultraviolet (UV) LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

Certain embodiments disclosed herein relate to the use of flip chip LED devices or flip chip pixelated-LED chips in which a light-transmissive substrate (and particularly, discontinuous portions of the substrate) represent(s) the exposed light emitting surface. In certain embodiments, the light-transmissive substrate embodies or includes an LED growth substrate, wherein multiple LEDs are grown on the same substrate that forms a light emitting surface or region. In certain embodiments, a pixelated-LED chip includes multiple active layer portions formed from an active layer grown on a growth substrate. In certain embodiments, the pixels may share functional layers of the pixelated-LED chip. In certain embodiments, one or more portions (e.g., spanning an entire width) of a growth substrate and/or portions of epitaxial layers may be thinned or removed. In certain embodiments, a second substrate (such as a carrier substrate or a temporary substrate to perform chip processing) may be added to the pixelated-LED chip or precursor thereof, whether or not a growth substrate has been partially or fully removed. In certain embodiments, a light-transmissive substrate includes SiC, sapphire, or glass. Multiple LEDs (e.g., flip chip LEDs or flip chip pixels) may be grown on a substrate and incorporated into a light emitting device. In certain embodiments, a substrate (e.g., silicon (Si)) may include vias arranged to make contact with LED chips mounted or grown thereon. In certain embodiments, as an alternative to using flip chips, individual LEDs or LED packages may be individually placed and mounted on or over a substrate to form an array. For example, multiple wafer level packaged LEDs may be used to form LED arrays or subarrays.

When LEDs embodying a flip chip configuration are used, desirable flip chip LEDs incorporate multi-layer reflectors and incorporate light-transmissive (preferably transparent) substrates that are optionally patterned along an internal surface adjacent to semiconductor layers (e.g., semiconductor layers forming an active region, with patterning between the substrate and the active region). A flip chip LED, or a flip chip pixel in some embodiments, includes anode and cathode contacts that are spaced apart and extend along the same face, with such face opposing a face defined by the light-transmissive (preferably transparent) substrate. A flip chip LED may be termed a horizontal structure, as opposed to a vertical structure having contacts on opposing faces of an LED chip. In certain embodiments, the transparent substrate may be patterned, roughened, or otherwise textured to provide a varying surface that increases the probability of refraction over internal reflection, so as to enhance light extraction. A substrate may be patterned or roughened by any of various methods known in the art, including (but not limited to) formation of nano-scale features by etching (e.g., photolithographic etching) using any suitable etchants, optionally in combination with one or more masks.

In certain embodiments, an outward light extraction surface of a substrate (whether a growth substrate or a substrate bonded to a subassembly that includes an active region) may comprise a microtextured etched surface having a non-repeating, irregular textural pattern (e.g., with an average feature depth in a range of from 120 nm to 400 nm, and preferably free of any plurality of equally sized, shaped, and spaced textural features). In certain embodiments, a microtextured etched surface of a substrate may be formed after thinning of the substrate, and after underfill steps (such as disclosed herein) are completed, but prior to application of a lumiphoric material over the substrate. The microtextured etched surface may be formed by applying a micromask having first and second solid materials of different etching rates over the light extraction surface, and exposing the micromask to an etchant (e.g., via reactive ion etching) to form a microtextured etched surface having a non-repeating, irregular textural pattern. Methods for forming such a surface are disclosed in U.S. Provisional Patent Application No. 63/044,746 filed on Jun. 26, 2020 and naming Cree, Inc. as the Applicant, wherein the entire disclosure of such application is hereby incorporated by reference herein.

In certain embodiments, a non-repeating, irregular textural pattern of a microtextured etched surface may comprise an average feature depth in a range of from 120 nm to 400 nm, or in a range of 150 nm to 350 nm, or in a range of 200 nm to 350 nm. In certain embodiments, a non-repeating, irregular textural pattern may include multiple plateau regions with localized pits defined in upper surfaces thereof.

A plateau region may have a predominantly flat upper surface except along lateral boundaries thereof (which may have rounded edges toward lower-lying areas) and except for the presence of pitted areas. Valley regions of various widths may be provided between plateau regions. In certain embodiments, plateau regions may be interconnected in various irregular shapes. In certain embodiments, at least some plateau regions may comprise substantially parallel scoring marks along upper surfaces thereof, with such scoring marks having been imparted by surface grinding (e.g., prior to masking and etching). In certain embodiments, a non-repeating irregular textural pattern may comprise a tiered microstructure including plateau regions provided at different heights. In certain embodiments, a tiered microstructure may include a first plurality of plateau regions at a first height and a second plurality of plateau regions at a second height that differs from the first height, with the presence of valley regions and/or pit regions that are deeper than the first and second pluralities of plateau regions.

In certain embodiments, a non-repeating, irregular textural pattern includes a plurality of irregularly shaped first features of a first height, a plurality of valley regions extending between different irregularly shaped first features, and a plurality of irregularly shaped second features of a second height that is less than the first height, with the plurality of irregularly shaped second features being arranged within the plurality of valley regions. In certain embodiments, at least some of the plurality of irregularly shaped first features of a first height comprise plateau regions When etching is performed to provide a substrate with a microtextured etched surface as an outward light extraction surface thereof, the presence of a scattering material (e.g., $TiO_2$) at a high concentration in trenches or streets proximate to the outward light extraction surface may be beneficial to shield the trenches from an etchant (such as reactive ion etching plasma). $TiO_2$ is substantially unaffected by RIE plasma. If a high concentration of $TiO_2$ is absent from at least an upper portion of a trench proximate to a light extraction surface of a substrate, then the etchant may attack passivation material that may be proximate to an active region (or other wafer fabricated areas) along sidewalls of the trench. This ability of $TiO_2$ (i.e., when present at high concentrations) to shield sidewall portions of trenches between pixels therefore provides a protective benefit separate from any optical benefits that may be conferred by its reflective properties.

In certain embodiments, LEDs or pixels may be grown on a first substrate of a first material (e.g., Si, SiC, or sapphire), the first (growth) substrate may be partially removed (e.g., thinned) or fully removed, and the LEDs or pixels may be bonded to, mounted to, or otherwise supported by a second substrate of a second material (e.g., glass, sapphire, etc.) through which LED emissions are transmitted, wherein the second material is preferably more transmissive of LED emissions than the first material. Removal of the first (growth) substrate may be done by any appropriate method, such as by use of an internal parting region or parting layer that is weakened and/or separated by: application of energy (e.g., laser rastering, sonic waves, heat, etc.), fracturing, one or more heating and cooling cycles, chemical removal, and/or mechanical removal (e.g., including one or more grinding, lapping, and/or polishing steps), or by any appropriate combination of techniques. In certain embodiments, one or more substrates may be bonded or otherwise joined to a carrier. Bonding of one or more LEDs or pixels to a substrate, or bonding of substrates to a carrier, may be performed by any suitable methods. Any suitable wafer bonding technique known in the art may be used such as van der Waals bonds, hydrogen bonds, covalent bonds, and/or mechanical interlocking. In certain embodiments, direct bonding may be used. In certain embodiments, bonding may include one or more surface activation steps (e.g., plasma treatment, chemical treatment, and/or other treatment methods) followed by application of heat and/or pressure, optionally followed by one or more annealing steps. In certain embodiments, one or more adhesion promoting materials may additionally or alternatively be used.

In certain embodiments, an LED array includes multiple flip chip LEDs or flip chip pixels grown on a single first (or growth) substrate, with the first substrate removed from the LEDs, and a second substrate (or carrier) added to the LEDs, with the second substrate including one or more reflective layers, vias, and a phosphor layer (e.g., spin-coated phosphor layer). In certain embodiments, an LED array includes multiple flip chip LEDs or flip chip pixels grown on a single growth substrate, wherein grooves, recesses, or other features are defined in the growth substrate and/or a carrier, and are used to form light-affecting elements, optionally being filled with one or more materials such as to form a grid between individual LEDs or pixels.

In certain embodiments utilizing flip chip LEDs or flip chip pixels, a light-transmissive substrate, a plurality of semiconductor layers, a multi-layer reflector, and a passivation layer may be provided. The light-transmissive substrate is preferably transparent with a patterned surface including a plurality of recessed features and/or a plurality of raised features. The plurality of semiconductor layers is adjacent to the patterned surface, and includes a first semiconductor layer comprising doping of a first type and a second semiconductor layer comprising doping of a second type, wherein a light emitting active region is arranged between the first semiconductor layer and the second semiconductor layer. The multi-layer reflector is arranged proximate to the plurality of semiconductor layers and includes a metal reflector layer and a dielectric reflector layer, wherein the dielectric reflector layer is arranged between the metal reflector layer and the plurality of semiconductor layers. The passivation layer is arranged between the metal reflector layer and first and second electrical contacts, wherein the first electrical contact is arranged in conductive electrical communication with the first semiconductor layer, and the second electrical contact is arranged in conductive electrical communication with the second semiconductor layer. In certain embodiments, a first array of conductive microcontacts extends through the passivation layer and provides electrical communication between the first electrical contact and the first semiconductor layer, and a second array of conductive microcontacts extends through the passivation layer. In certain embodiments, a substrate useable for forming and supporting an array of flip chip LEDs or flip chip pixels may include sapphire; alternatively, the substrate may include Si, SiC, a Group III-nitride material (e.g., GaN), or any combination of the foregoing materials (e.g., Si on sapphire, etc.). Further details regarding fabrication of flip chip LEDs are disclosed in U.S. Patent Application Publication No. 2017/0098746A1, with the entire contents thereof being hereby incorporated by reference herein.

Figure 3A:
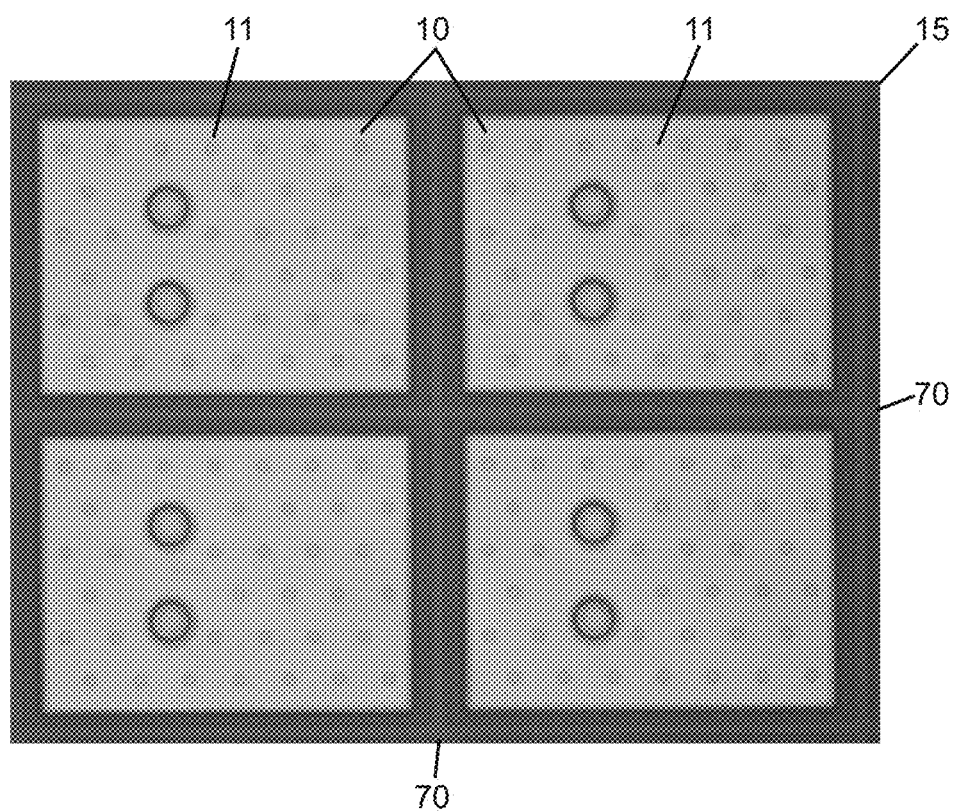
FIG. 3A is a plan view photograph of a pixelated-LED chip including an array of four flip chip type LEDs on a single transparent substrate facing upward, useable in embodiments of the present disclosure.
Figure 3B:
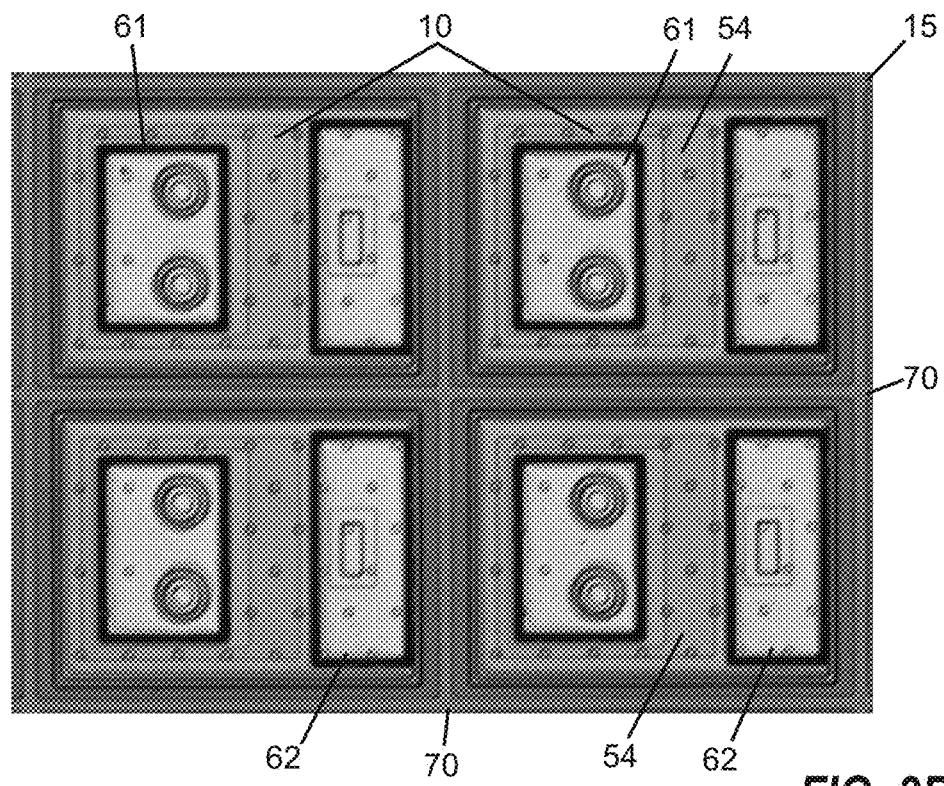
FIG. 3B is a plan view photograph of the pixelated-LED chip of FIG. 3A, with electrodes facing upward.
Figure 4A:
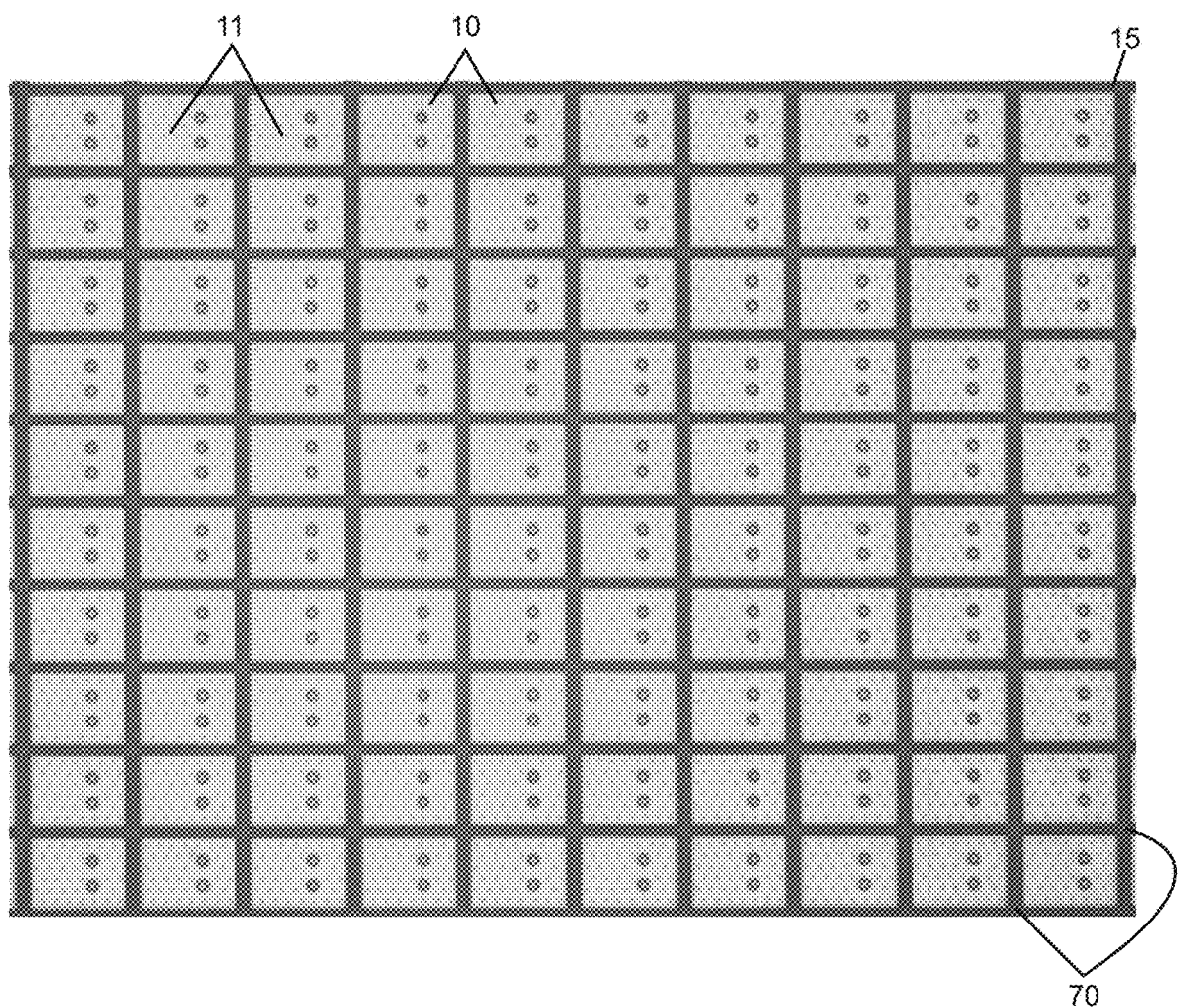
FIG. 4A is a plan view photograph of a pixelated-LED chip including an array of one hundred flip chip LEDs on a single transparent substrate facing upward, useable in embodiments of the present disclosure.
Figure 4B:
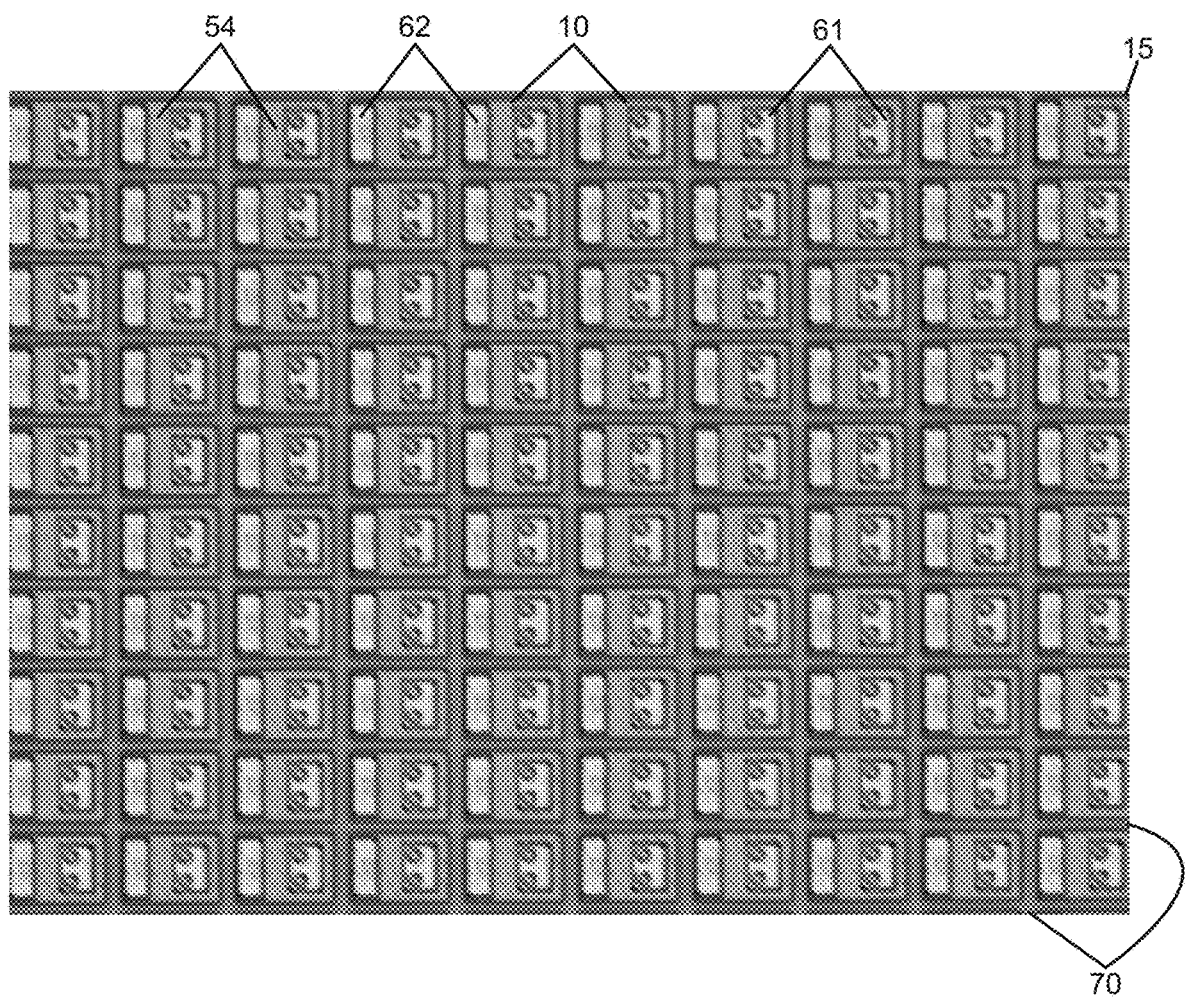
FIG. 4B is a plan view photograph of the pixelated-LED chip of FIG. 4A, with electrodes facing upward.
Figure 5:
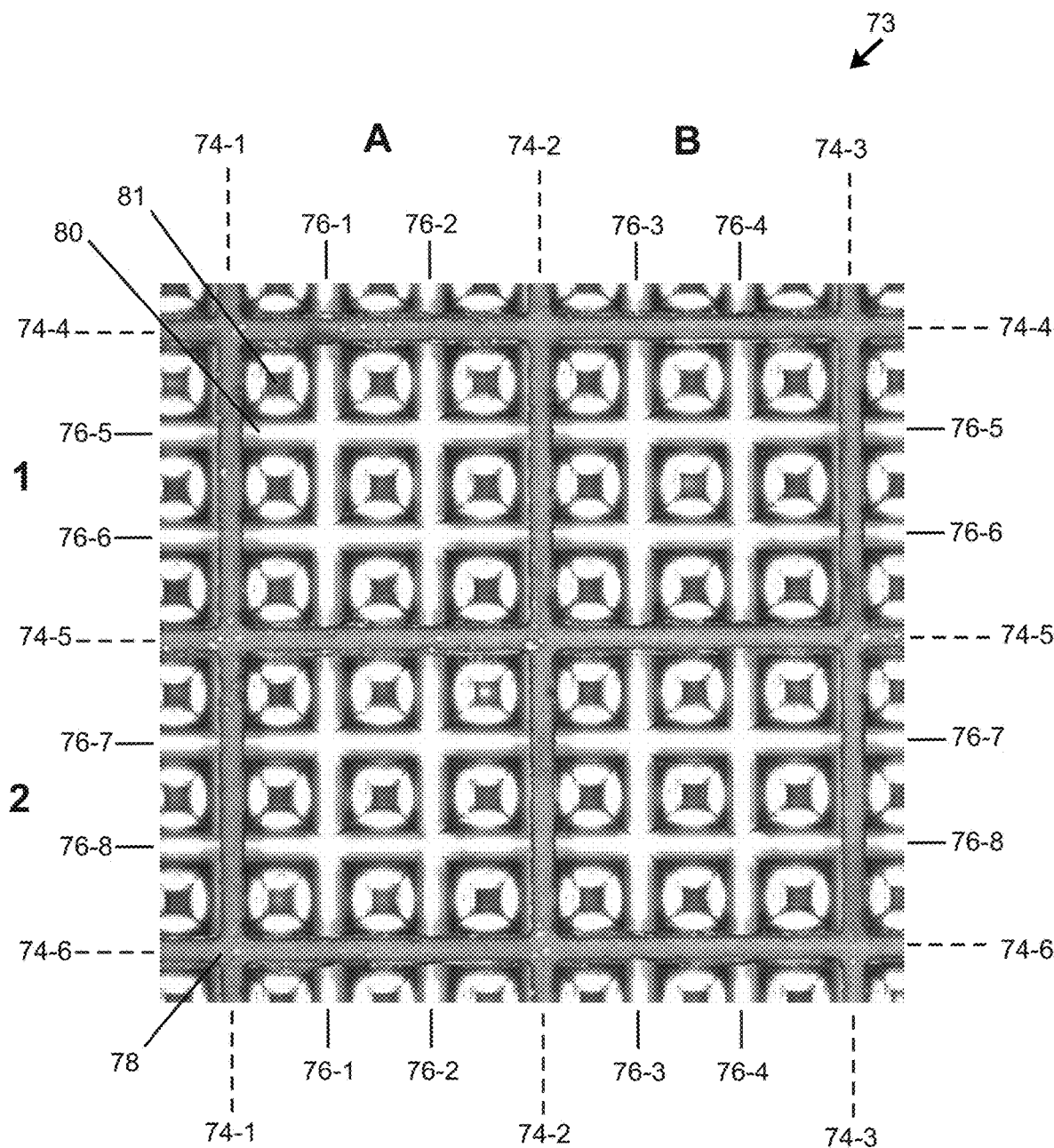
FIG. 5 is an upper perspective view photograph of a portion of a pixelated-LED light emitting device incorporating pixelated-LED chips according to a design in which light extraction surfaces have macrotextural features, in order to illustrate pixel placement and spacing.

FIGS. 1 to 4B depict pixelated-LED chips to provide a general introduction to features thereof, and FIG. 5 illustrates a device incorporating multiple pixelated LED chips, as features of these figures may be incorporated into pixelated-LED chips and fabrication steps according to various embodiments that will be described thereafter in connection with FIGS. 6A to 8.

FIG. 1 illustrates a single flip chip LED 10 including a light-transmissive substrate 15, first and second electrical contacts 61, 62, and a functional stack 60 (incorporating at least one light emitting active region 25) arranged therebetween. The flip chip LED 10 includes an internal light-transmissive surface 14 that is patterned (with multiple recessed and/or raised features 17) proximate to multiple semiconductor layers 21, 22 of the LED 10, including a multi-layer reflector proximate to the semiconductor layers 21, 22 according to one embodiment. The light-transmissive (preferably transparent) substrate 15 has an outer major surface 11, side edges 12, and the patterned surface 14. The multiple semiconductor layers 21, 22 sandwiching the light emitting active region 25 are adjacent to the patterned surface 14, and may be deposited via vapor phase epitaxy or any other suitable deposition process. In one implementation, a first semiconductor layer 21 proximate to the substrate 15 embodies an n-doped material (e.g., n-GaN), and a second semiconductor layer 22 embodies a p-doped material (e.g., p-GaN). A central portion of the multiple semiconductor layers 21, 22 including the active region 25 extends in a direction away from the substrate 15 to form a mesa 29 that is laterally bounded by at least one recess 39 containing a passivation material (e.g., silicon nitride (SiN) as part of a passivation layer 50), and that is vertically bounded by surface extensions 21A of the first semiconductor layer 21.

The multi-layer reflector is arranged proximate to (e.g., on) the second semiconductor layer 22, with the multi-layer reflector consisting of a dielectric reflector layer 40 and a metal reflector layer 42. The dielectric reflector layer 40 is arranged between the metal reflector layer 42 and the second semiconductor layer 22. In certain implementations, the dielectric reflector layer 40 comprises silicon dioxide ($SiO_2$), and the metal reflector layer 42 comprises Ag. Numerous conductive vias 41-1, 41-2 are defined in the dielectric reflector layer 40 and are preferably arranged in contact between the second semiconductor layer 22 and the metal reflector layer 42. In certain implementations, the conductive vias 41-1, 41-2 comprise substantially the same material(s) as the metal reflector layer 42. In certain implementations, at least one (preferably both) of the dielectric reflector layer 40 and the metal reflector layer 42 is arranged over substantially the entirety of a major surface of the mesa 29 terminated by the second semiconductor layer 22 (e.g., at least about 90%, at least about 92%, or at least about 95% of the major (e.g., lower) surface of the mesa 29 of the second semiconductor layer 22).

A barrier layer 48 (including first and second portions 48-1, 48-2) is preferably provided between the metal reflector layer 42 and the passivation layer 50. In certain implementations, the barrier layer 48 comprises sputtered titanium (Ti)/platinum (Pt) followed by evaporated gold (Au), or comprises sputtered Ti/nickel (Ni) followed by evaporated Ti/Au. In certain implementations, the barrier layer 48 may function to prevent migration of metal from the metal reflector layer 42. The passivation layer 50 is arranged between the barrier layer 48 and (i) the first externally accessible electrical contact (e.g., electrode, or cathode) 61 and (ii) the second externally accessible electrical contact (e.g., electrode, or anode) 62, which are both arranged along a lower surface 54 of the flip chip LED 10 separated by a gap 59. In certain implementations, the passivation layer 50 comprises SiN. The passivation layer 50 includes a metal-containing interlayer 55 arranged therein, wherein the interlayer 55 may include (or consist essentially of) aluminum (Al) or another suitable metal.

The LED 10 includes first and second arrays of microcontacts 63, 64 extending through the passivation layer 50, with the first array of microcontacts 63 providing conductive electrical communication between the first electrical contact 61 and the first (e.g., n-doped) semiconductor layer 21, and with the second array of microcontacts 64 providing conductive electrical communication between the second electrical contact 62 and the second (e.g., p-doped) semiconductor layer 22. The first array of microcontacts 63 extends from the first electrical contact 61 (e.g., n-contact) through the passivation layer 50, through openings defined in the interlayer 55, through openings 52 defined in the first portion 48-1 of the barrier layer 48, through openings defined in a first portion 42-1 of the metal reflector layer 42, through openings defined in a first portion 40-1 of the dielectric reflector layer 40, through the second semiconductor layer 22, and through the active region 25 to terminate in the first semiconductor layer 21. Within the openings defined in the interlayer 55, the first portion 48-1 of the barrier layer 48, the first portion 42-1 of the metal reflector layer 42, and the first portion 40-1 of the dielectric reflector layer 40, dielectric material of the dielectric reflector layer 40 laterally encapsulates the first array of microcontacts 63 to prevent electrical contact between the first array of microcontacts 63 and the respective layers 55, 48, 42, 40. The conductive vias 41-1 defined in the first portion 40-1 of the dielectric reflector layer 40 contact the first portion 40-1 of the dielectric reflector layer 40 and the second semiconductor layer 22, which may be beneficial to promote current spreading in the active region 25. The second array of microcontacts 64 extends from the second electrical contact 62 through the passivation layer 50 and through the openings defined in the interlayer 55 to at least one of (i) the second portion 48-2 of the barrier layer 48, and (ii) a second portion 42-2 of the metal reflector layer 42, wherein electrical communication is established between the metal reflector layer 42 and the second semiconductor layer 22 through the conductive vias 41-2 defined in a second portion 40-2 of the dielectric reflector layer 40. Although the second array of microcontacts 64 is preferred in certain implementations, in other implementations, a single second microcontact may be substituted for the second array of microcontacts 64. Similarly, although it is preferred in certain implementations to define multiple vias 41-2 in the second portion 40-2 of the dielectric reflector layer 40, in other implementations, a single via or other single conductive path may be substituted for the conductive vias 41-2.

Following formation of the passivation layer 50, one or more side portions 16 extending between the outer major surface 11 of the substrate 15 and the surface extensions 21A of the first semiconductor layer 21 are not covered with passivation material. Such side portions 16 embody a non-passivated side surface.

In operation of the flip chip LED 10, current may flow from the first electrical contact (e.g., n-contact or cathode) 61, the first array of microcontacts 63, and the first (n-doped) semiconductor layer 21 into the active region 25 to generate light emissions. From the active region 25, current flows through the second (p-doped) semiconductor layer 22, the conductive vias 41-2, the second metal reflector layer portion 42-2, the second barrier layer portion 48-2, and the second array of microcontacts 64 to reach the second electrical contact (e.g., p-contact or anode) 62. Emissions generated by the active region 25 are initially propagated in all directions, with the reflector layers 40, 42 serving to reflect emissions in a direction generally toward the substrate 15. As emissions reach the patterned surface 14 arranged between the substrate 15 and the first semiconductor layer 21, the recessed and/or raised features 17 arranged in or on the patterned surface 14 promote refraction rather than reflection at the patterned surface 14, thereby increasing the opportunity for photons to pass from the first semiconductor layer 21 into the substrate 15 and thereafter exit the LED 10 through the outer major surface 11 and non-passivated side portions 16. In certain implementations, one or more surfaces of the LED 10 may be covered with one or more lumiphoric materials (not shown), to cause at least a portion of emissions emanating from the LED 10 to be up-converted or down-converted in wavelength.

Figure 2A:
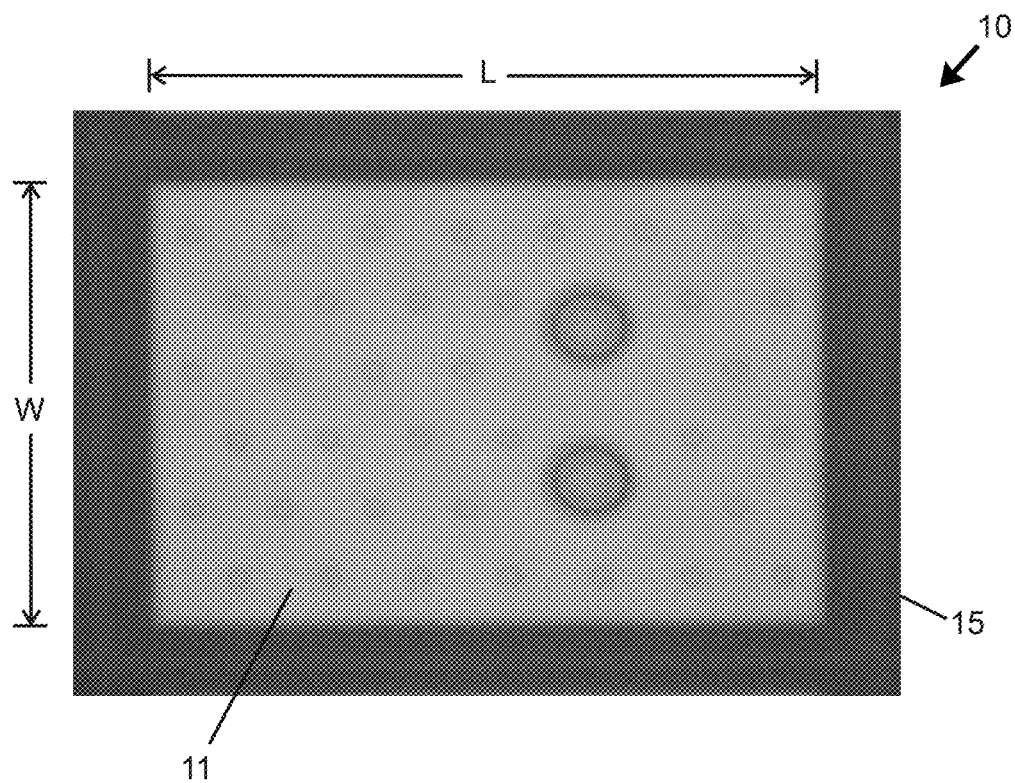
FIG. 2A is a plan view photograph of a flip chip LED, with a transparent substrate facing upward, useable in flip chip arrays according to embodiments of the present disclosure.
Figure 2B:
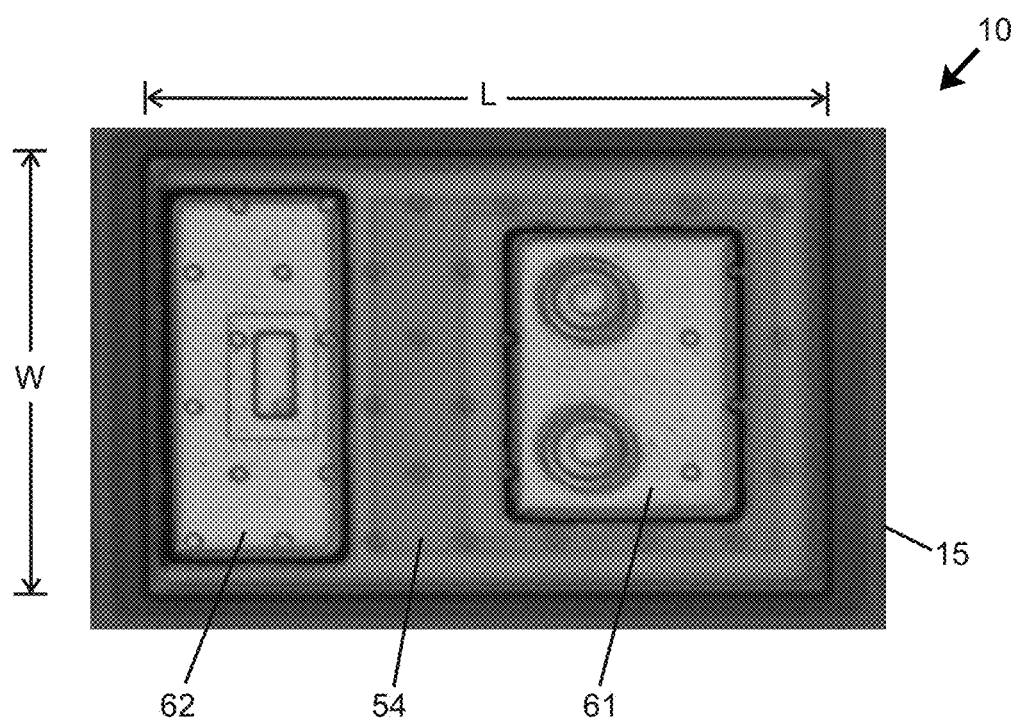
FIG. 2B is a plan view photograph of the flip chip LED of FIG. 2A, with electrodes facing upward.

FIGS. 2A and 2B are plan view photographs of a single flip chip LED 10 similar in structure and operation to the flip chip LED 10 of FIG. 1. Referring to FIG. 2A, the flip chip LED 10 includes an outer major surface 11 arranged for extraction of LED emissions, and includes an active region having a length L and a width W. In certain embodiments, the active region includes a length L of about 280 microns (μm), and a width W of about 220 μm, and a substrate 15 extends beyond the active region. Referring to FIG. 2B, the flip chip LED 10 includes a cathode (e.g., first electrical contact) 61 and an anode (e.g., second electrical contact) 62 arranged along a lower surface 54. In certain embodiments, the cathode 61 includes length and width dimensions of about 95 μm by 140 μm, and the anode 62 includes length and width dimensions of about 70 μm by 170 μm.

FIGS. 3A and 3B are plan view photographs of a pixelated-LED chip including an array of four flip chip LEDs 10 formed on a single transparent substrate 15, with each flip chip LED 10 being substantially similar in structure and operation to the flip chip LED 10 of FIG. 1. Each flip chip LED 10 includes an active layer portion of an active layer. The active layer portion of each flip chip LED 10 is spaced apart from the active area of each adjacent flip chip LED 10 by a gap (e.g., 40 μm in a length direction and 30 μm in a width direction). A central portion of each gap embodies a street 70 (e.g., having a width of about 10 μm) consisting solely of the substrate 15, whereas peripheral portions of each gap (between each street 70 and active areas of LEDs 10) includes the substrate 15 as well as passivation material (e.g., the passivation layer 50 shown in FIG. 1). Each street 70 thus represents a boundary between adjacent flip chip LEDs 10. Each flip chip LED 10 includes a cathode 61 and an anode 62 arranged along a lower surface 54, and each flip chip LED 10 is arranged to emit light through an outer major surface 11 of the substrate 15. The exposed cathodes 61 and anodes 62 permit separate electrical connections to be made to each flip chip LED 10, such that each flip chip LED 10 may be individually addressable and independently electrically accessed. Additionally, this allows groups or subgroups of the flip chip LEDs 10 to be accessed together, separately from other flip chip LEDs 10. If it were desired to separate the flip chip LEDs 10 from one another, then a conventional method to do so would be to utilize a mechanical saw to cut through the streets 70 to yield individual flip chip LEDs 10.

FIGS. 4A and 4B are plan view photographs of a pixelated-LED chip including an array of one hundred flip chip LEDs 10 on a single transparent substrate 15, with each flip chip LED 10 being substantially similar in structure and operation to the flip chip LED 10 illustrated in FIG. 1. The flip chip LEDs 10 are separated from one another by gaps including streets 70. Each flip chip LED 10 includes an outer major surface 11 arranged for extraction of LED emissions, and includes a cathode 61 and an anode 62 arranged along a lower surface 54. The exposed cathodes 61 and anodes 62 permit separate electrical connections to be made to each flip chip LED 10, such that each flip chip LED 10 may be individually addressable and independently electrically accessed.

In certain embodiments, each flip chip LED of an array of LEDs supported by a single substrate (e.g., a pixelated-LED chip) includes a greatest lateral dimension of no greater than about 400 µm, about 300 µm, or about 200 µm. In certain embodiments, each flip chip LED pixel of an array of LEDs supported by a single substrate includes inter-pixel spacing of no greater than about 60 µm, or about 50 µm, or about 40 µm, or about 30 µm, or about 20 µm, or about 10 µm. Such dimensional ranges provide a desirably small pixel pitch.

In certain embodiments, a pixelated-LED chip includes LEDs serving as pixels each having a substantially square shape. In certain embodiments, a pixelated-LED chip includes LEDs serving as pixels each having a rectangular (but non-square) shape. In other embodiments, LEDs may be provided as pixels having hexagonal shapes, triangular shapes, round shapes, or other shapes.

In certain embodiments, a pixelated-LED chip may include LEDs provided in a two-dimensional array as pixels of about 70 µm long×70 µm wide, each including an active region of about 50 µm long×50 µm wide, thereby providing a ratio of emitting area to total area of $0.0025$ mm$^2$/$0.0049$ mm$^2$=$0.51$ (or 51%). In certain embodiments, an array of at least 100 LEDs (as shown in FIG. 4B) may be provided in an area of no greater than 32 mm long×24 mm wide, with spacing between LEDs (pixel pitch) of no greater than 40 µm in the length direction and no greater than 30 µm in the width direction. In certain embodiments, each LED may include an emissive area of 280 µm long×210 µm wide (totaling an area of 0.0588 mm$^2$). Considering a total top area of 320 µm long×240 µm wide (totaling an area of 0.0768 mm$^2$) for each LED, a ratio of emissive area to total area (i.e., including emissive area in combination with non-emissive area) along a major (e.g., top) surface is 76.6%. In certain embodiments, a light emitting device as disclosed herein includes a ratio of emissive area to non-emissive (or dark) area along a major (e.g., top) surface of at least about 30%, at least about 40%, at least about 50% (i.e., about 1:1 ratio of emitting area to non-emitting (dark) area), at least about 55%, at least about 60%, at least about 65%, at least about 70%, at least about 75%, or at least about 80%. In certain embodiments, one or more of the foregoing values may optionally constitute a range bounded by an upper value of no greater than 70%, 75%, 80%, 85%, or 90%. In certain embodiments, an array of at least 1000 LEDs may be provided.

Although FIGS. 2A, 2B, 3A, 3B, 4A, and 4B show each LED 10 as including two n-contact vias (embodying vertically offset circles registered with the n-contact or cathode 61), in certain embodiments, n-contacts and any associated n-contact vias may be shifted laterally and provided in a dark area outside the emitting area of each LED 10.

As noted previously, the omnidirectional character of LED and phosphor emissions may render it difficult to prevent emissions of one LED (e.g., a first pixel) from significantly overlapping emissions of another LED (e.g., a second pixel) of an array of flip chip LEDs arranged on a single light-transmissive substrate. A single transparent substrate supporting multiple flip chip LEDs would permit light beams to travel in numerous directions, leading to light scattering and loss of pixel-like resolution of emissions transmitted through the substrate. Problems of light scattering and loss of pixel-like resolution would be further exacerbated by presence of one or more lumiphoric materials overlying the light extraction surface of a substrate, owing to the omnidirectional character of lumiphor emissions. Embodiments disclosed herein may address this issue by providing light affecting elements (e.g., light segregation elements) configured to reduce interaction between emissions of different LEDs and/or lumiphoric material regions, thereby reducing scattering and/or optical crosstalk and preserving pixel-like resolution of the resulting emissions. In this manner, light segregation elements as described herein may additionally provide good contrast and/or sharpness between lit and unlit regions of LED arrays. In certain embodiments, exemplary light segregation elements may extend from a light injection surface into a substrate, may extend from a light extraction surface into a substrate, may extend outward from a light extraction surface, may be provided between sidewalls of adjacent pixels, or any combination of the foregoing. In certain embodiments, multiple light segregation elements may be defined by different methods in the same substrate and/or light emitting device.

In certain embodiments, light segregation utility may be provided in whole or in part by underfill material arranged between pixels of one or more pixelated-LED chips (wherein such underfill may also be provided between anodes and cathodes of pixels). According to such embodiments, one or more constituents of underfill material (such as particulate material constituents) may provide light scattering, light reflecting, or light absorbing utility.

In certain embodiments, an underfill material comprises particulate material suspended in a binding material, which may be applied in a flowable state. In certain embodiments, such particulate material may include metallic materials, metallic oxide materials, and/or non-metallic materials such as (but not limited to) silica, including (but not limited to) fused silica, fumed silica, and glass spheres. In certain embodiments, particulate material present in an underfill material may have an average (e.g., 50% size distribution) particle size in a range of 200 nm to 350 nm, or in a range of 210 nm to 320 nm. It is noted that reflective particle sizes of about 220 nm may exhibit strong reflectivity to blue light. A binding material may comprise an insulating binding material, such as silicone.

In certain embodiments, an underfill material comprises an optically reflective material to form an optically reflective underfill layer. Examples of optically reflective materials that may be used include, but are not limited to, titanium dioxide ($TiO_2$), zinc oxide ($ZnO$), and alumina ($Al_2O_3$).

In certain embodiments, an underfill material comprises an optical scattering material to form an optical scattering underfill layer. Examples of optical scattering materials include, but are not limited to, silicon dioxide ($SiO_2$) (e.g., in forms such as fumed silica, fused silica, or glass spheres, with such forms having different indices of refraction), air (e.g., in the form of bubbles present in a binding material such as silicone, optionally formed by adding air or a foaming agent to a binder such silicone), or the like.

In certain embodiments, an underfill material comprises a light-absorptive material to form a light-absorptive underfill layer, which may be useful to increase contrast between pixels at the expense of reduced total brightness. Examples of optical scattering materials include, but are not limited to, carbon black, black (or very dark) pigments, black (or very dark) inks, and the like.

In certain embodiments, an underfill material comprises a selectively light reflective, selectively light absorptive, and/or light filtering material. One example of a selectively light reflective material is chromium oxide, which serves to absorb blue light while reflecting others. Pigments, dyes, and filtering materials (including low-pass filter, high-pass filtering, bandpass filtering, and notch filtering materials) may be used in certain embodiments.

In certain embodiments, an underfill material comprises an etch-resistant material, such as any one or more of various metal oxides (including but not limited to $TiO_2$), to form an etch-resistant underfill layer. In certain embodiments, an etch-resistant underfill layer includes a higher concentration of metallic oxide material than an underlying underfill layer in which metallic oxide material may optionally be present.

In certain embodiments, underfill materials having different refractive indices may be used in different layers, such that different underfill material layers may have different indices of refraction. In certain embodiments, a underfill material layers having different refractive indices may be consecutively applied to provide progressively increasing or progressively decreasing refractive index values (e.g., from low to high, or from high to low).

In certain embodiments, an underfill material comprises optically reflective particles (e.g., at least one metallic oxide such as $TiO_2$) suspended in a silicone binder. In certain embodiments, a weight ratio of metallic oxide to silicone is in a range of 50% to 150%. In some embodiments, a weight ratio of metallic oxide to silicone is about 100%, or about 1:1. Additionally, a solvent may be added to alter the viscosity of the underfill material to improve flow and filling between pixels.

In certain embodiments, individual underfill material layers may have thicknesses in a range of 1 μm to 100 μm, or in a range of 1 μm to 50 μm, or in a range of 1 μm to 30 μm, or in a range of 3 μm to 25 μm, or in a range of 5 μm to 20 μm, or in a range of 3 μm to 10 μm, or in a range of 10 μm to 15 μm.

In certain embodiments, an aggregate thickness of multiple underfill layers may be in a range of 15 μm to 200 μm, or in a range of 15 μm to 170 μm, or in a range of 15 μm to 150 μm, or in a range of 15 μm to 100 μm, or in a range of 15 μm to 50 μm.

In certain embodiments, individual underfill layers present in a single light emitting device may have thicknesses that differ from one another in various ratios. In certain embodiments, a thickness ratio between sequentially applied first and second underfill layers may range from 1:1 to 10:1 (or 2:1 to 10:1), wherein such ratio may depend in part on the aggregate thickness of the underfill layers, width between pixels (e.g., street width), and/or the function of the respective layers. For example, for an aggregate underfill thickness of about 30 μm including two underfill layers, a first underfill layer may have a thickness in a range of 20 μm to 28 μm, and a second underfill layer may have a thickness in a range of 10 μm to 2 μm (spanning a thickness ratio range of 2:1 to 14:1). For underfill layers of a greater aggregate thickness, such as 50 μm to 150 μm, a thickness ratio between individual layers may be in a range of 1:1 to 20:1 for a two-layer combination.

In certain embodiments, uppermost or "cap" underfill layers intended to provide resistance to etching (e.g., reactive ion etching) may be very thin in character, such as in a range of 1 μm to 3 μm. Various metallic oxides such as (but not limited to) oxides of titanium and aluminum may be used in uppermost or cap underfill material layers to confer etch resistance.

In certain embodiments, one or more underfill layers comprise a binder (e.g., silicone) and reflective material particles (e.g., $TiO_2$) with a particle concentration that increases (either stepwise or in a gradient manner) in a direction from a substrate to a light extraction surface of a pixelated-LED chip to provide increased light reflectivity. In certain embodiments, one or more underfill layers comprises an etch-resistant material (e.g., a metallic oxide such as $TiO_2$) that provides enhanced resistance to etchants that may be used for texturing the light extraction surface after underfill is applied. In certain embodiments, one or more light-scattering and/or void-filling materials (e.g., fumed silica) may be provided in a concentration that also increases with distance in a direction from a substrate to a light extraction surface of a pixelated LED chip.

In certain embodiments, an initially applied or "base" underfill material comprises a particulate material present in a binder in a first weight percent ratio, and one or more subsequently applied (e.g., intermediate and/or cap) underfill layers may particulate material present in a binder at a second weight percent ratio that exceeds the first weight percent ratio (e.g., by a factor of 2 to 10 or more). In certain embodiments, particulate material present in an initially applied or base underfill material may predominantly comprise (e.g., at least 90 percent) metal oxide. Multiple metal oxides may be present. In certain embodiments, an initially applied or base underfill material layer comprises a rutile $TiO_2$ pigment such as Chemours (DuPont) Ti-Pure™ R-105 particulate material, which may comprise titanium dioxide (92 wt. % minimum), alumina (3.2 wt. % maximum), silica (3.5 wt. % maximum), and carbon (0.2 wt. % minimum), with a median particle size of either 310 nm or 220 nm, with the foregoing particulate material present in a silicone binder.

In certain embodiments, an underfill material comprises a material with a high durometer on a Shore hardness scale (e.g., a high durometer silicone material). A material with a high durometer value, or hardness, in the underfill material provides mechanical stability or anchoring of pixels of the pixelated-LED chip. For example, the underfill material may comprise a material, such as silicone, with a Shore D hardness scale durometer value of at least 40. In further embodiments, the underfill material may comprise a material with a Shore D hardness scale durometer value in a range of from about 40 to about 100 or in a range from about 60 to about 80.

In certain embodiments wherein less mechanical support may be needed, then underfill material having a Shore A hardness scale durometer value of about 40 (e.g., Shore A hardness in a range of 20-60, or in a range of 30-50) may be used, in order to reduce or eliminate any coefficient of thermal expansion (CTE) forces that would otherwise be created by expanding silicon. In certain embodiments, an underfill material may comprise gel silicone such as DOW-SIL™ JCR 6140 optical encapsulant, which is commercially available from The Dow Chemical Company (Midland, Mich., USA).

FIG. 5 is an upper perspective view photograph of a portion of a pixelated-LED light emitting device 72 that incorporates pixelated-LED chips and includes an underfill material 73, with the device 72 showing a plurality of pixels A1, A2, B1, and B2. Alphanumeric column labels A and B appear at top between vertical dashed lines, and Arabic numerals 1 and 2 appear at left between horizontal dashed lines to provide column and row references for individual pixels. The vertical and horizontal dashed lines correspond to street-aligned cut lines or regions 74-1 to 74-6 that define lateral borders and inter-pixel spaces between the pixels A1, A2, B1, and B2. Dashed lines extending outward beyond the image represent extensions of boundaries between pixels. The vertical and horizontal solid lines correspond to cut lines or regions 76-1 to 76-8 that are not aligned with streets between pixels. As shown, the cut lines or regions 76-1 to 76-8 are provided to form a macroscopically patterned surface to promote extraction of light from each pixel. The underfill material 73 is configured along the lateral borders of each pixel A1, A2, B1, B2 for improved contrast. The width of the street-aligned cut lines 74-1 to 74-6 forms at least a portion of the spacing between pixels. Each pixel A1, A2, B1, B2 of the pixelated-LED light emitting device 72 may be spaced from adjacent pixels by a distance no greater than about 60 μm, or about 50 μm, or about 40 μm, or about 30 μm, or about 20 μm, or about 10 μm, or in a range of from about 10 μm to about 30 μm, or in a range of from about 10 μm to about 20 μm. Such dimensional ranges provide a desirably small pixel pitch. The spacing between pixels also relates to the width of the underfill material 73 that is configured between adjacent pixels. For example, a 25 μm spacing between pixels allows more of the underfill material 73 (about 25 μm width) to be configured between adjacent pixels than a pixel spacing of 20 μm. Accordingly, more light may be reflected and redirected out of each pixel without leaking into an adjacent pixel by the underfill material 73 with 25 μm spacing compared to the underfill material 73 with 20 μm spacing, thereby providing improved contrast and pixel brightness. Notably, for a constant spacing between the street-aligned cut lines 74-1 to 74-6, a pixel spacing of 25 μm reduces the area of each pixel; however, the increase in the underfill material 73 may still provide brighter pixels with improved contrast.

The cut lines 76-1 to 76-8 form a plurality of light extraction surface recesses 78 that intersect and segregate a plurality of protruding features 80. For example, in the pixel A1, the vertical cut lines 76-1 and 76-2 and the horizontal cut lines 76-5 and 76-6 form two vertical and two horizontal light extraction surface recesses 78 that intersect and define nine protruding features 80. The shape of a cutting tool as well as the number and direction of cut lines defines the shape of the protruding features 80. In FIG. 5, the cut lines 76-1 to 76-4 are evenly spaced vertical lines that intersect with evenly spaced and orthogonal horizontal cut lines 76-5 to 76-8, and are formed with a beveled cutting tool. Accordingly, the protruding features 80 comprise square-base pyramidal shapes. If desired, the pyramidal shapes may comprise truncated pyramidal shapes, wherein such truncation may be vertical, lateral, or both vertical and lateral in character. Other shapes are possible, including triangle-shaped features, extruded triangle-shaped features and cuboid-shaped features. If desired, the cut lines 76-1 to 76-8 may comprise intersecting diagonal lines to form other shapes, such as diamond-shaped features or other polyhedral features.

FIG. 5 shows pixelated-LED chips with light extraction surfaces that have macrotextural features (e.g., formable by angle cutting with a rotary saw), but in certain embodiments, pixelated-LED chips may have light extraction surfaces devoid of macrotextural features. In certain embodiments, a light extraction surface of a pixelated-LED chip may embody a microtextured etched surface having a non-repeating, irregular textural pattern (e.g., with an average feature depth in a range of from 120 nm to 400 nm, and preferably free of any plurality of equally sized, shaped, and spaced textural features).

In certain embodiments, inter-pixel spaces may be provided between adjacent pixels in a pixelated-LED chip. Inter-pixel spaces are formed when individual pixels are defined within a pixelated-LED chip and may include spaces between various elements of adjacent pixels, including active layer portions, substrate portions, and electrical contacts, among others. In certain embodiments, an underfill material is arranged in the inter-pixel spaces to cover all lateral surfaces between adjacent pixels. Additionally, the underfill material may substantially fill entire inter-pixel spaces between adjacent pixels. In certain embodiments, the electrical contacts for each pixel include an anode and a cathode and the underfill material is additionally arranged between the anode and cathode of each pixel.

Figure 6A:
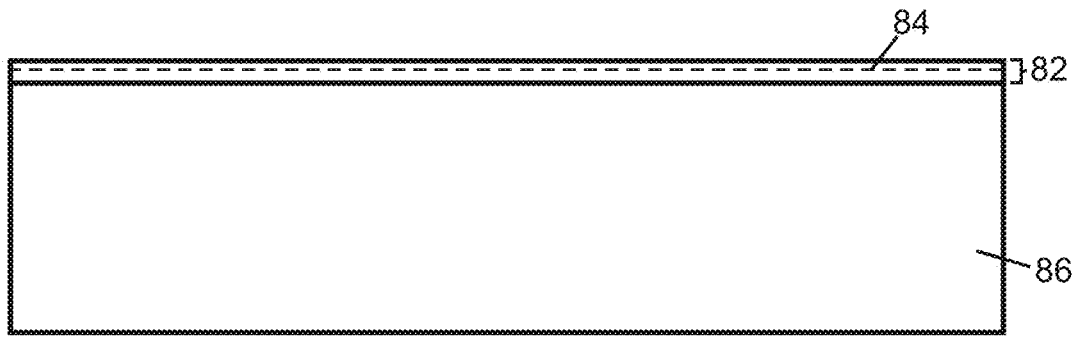
FIGS. 6A-6F are schematic cross-sectional views of various states of fabrication of a pixelated-LED chip in order to form pixels supported by discontinuous substrate portions.

FIGS. 6A-6F are schematic cross-sectional views of various states of fabrication of a pixelated-LED chip in order to form pixels supported by discontinuous substrate portions. In FIG. 6A, an LED structure 82 including an active layer 84 has been deposited on a substrate 86. The LED structure 82 may include a plurality of epitaxial layers deposited by metal organic chemical vapor deposition (MOCVD). In addition to the active layer 84, the LED structure 82 may further include one or more n-type semiconductor layers and one or more p-type semiconductor layers. In some embodiments, the LED structure 82 includes Group III-V nitrides including but not limited to GaN, aluminum gallium nitride (AlGaN), aluminum indium gallium nitride (AlInGaN), and indium gallium nitride (InGaN). An exemplary n-type dopant is Si and an exemplary p-type dopant is magnesium (Mg). The active layer 84 may be configured between at least one n-type layer and one p-type layer. The active layer 84 may include a single quantum well (SQW) structure that includes a layer of InGaN or a multiple quantum well (MQW) structure such as a plurality of layers that include alternating layers of InGaN and GaN. Other semiconductor materials are possible, including gallium arsenide (GaAs), gallium phosphide (GaP), and alloys thereof. The substrate 86 may include a light-transmissive material such as SiC or sapphire, although other substrate materials may be used.

Figure 6B:
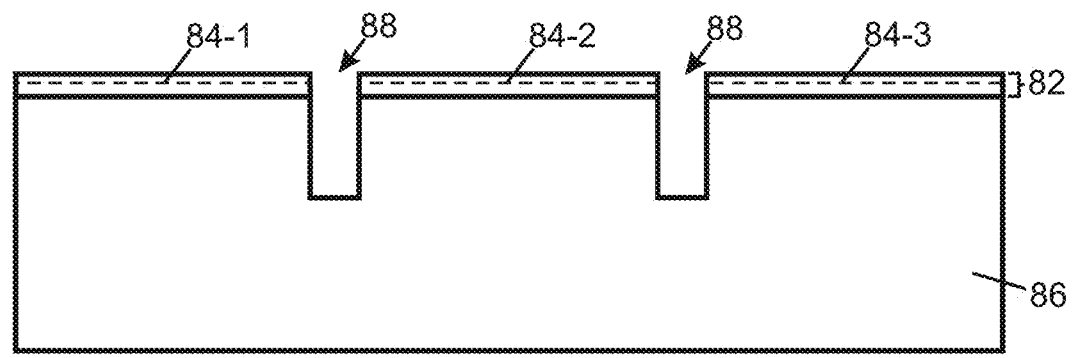

In FIG. 6B, a plurality of active layer portions 84-1 to 84-3 have been formed from the LED structure 82, following formation of a plurality of recesses or streets 88 that are configured to segregate the active layer portions 84-1, 84-2, and 84-3. Such trenches may be formed by applying a patterned mask over the substrate with openings corresponding to the desired position of recesses, then exposing the mask to a suitable etchant to selectively remove substrate material to a desired depth. In certain embodiments, the substrate material comprises silicon carbide, a mask material comprises copper, and a hydrofluoric acid solution may be used as an etchant. Conventionally, recesses or streets 88 are formed to a relatively shallow depth that is sufficient to segregate the active layer portions 84-1, 84-2, and 84-3 and penetrate a short distance (e.g., 10 μm to 20 μm) into a substrate 86 of a material such as silicon carbide, wherein the substrate 86 may have an initial thickness of a few hundred μm (e.g., 200 μm to 400 μm, or about 325 μm in some instances). However, in certain embodiments of the present disclosure, recesses or streets 88 of a greater depth (e.g., 30 μm to 50 μm, or 35 μm to 45 μm into the substrate 86) may be defined by etching, such as selecting a longer etching time. The depth that the recesses or streets 88 extend into the substrate 86 should be slightly greater than a desired height of substrate portions to be produced after the substrate 86 is subjected to a (post-etching) thinning process (such as grinding). For example, streets 88 may be formed to a depth of about 38 μm to 40 μm into a substrate 86 having an initial thickness of about 325 μm, and then the substrate may be ground to a thickness of about 35 μm in exposed openings into the streets 88 and segregate the substrate 86 into portions. By forming deep streets 88 and then thinning an entire upper portion of a substrate 86, discontinuous substrate portions with openings into the streets may be formed, without a need for sawing trenches through a substrate registered with underlying (shallow) streets according to alternative processes, such as disclosed by U.S. Patent Application Publication No. 2020/0203419 A1.

Figure 6C:
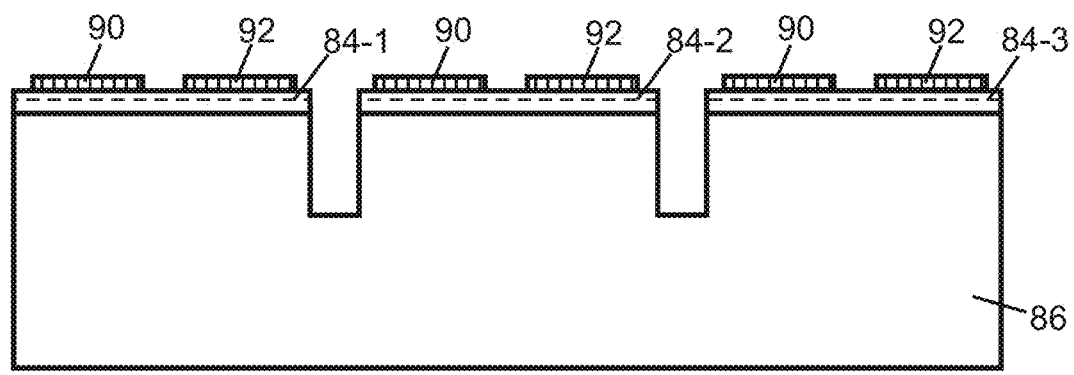

In FIG. 6C, electrical contacts that include an anode 90 and a cathode 92 are deposited over each of the active layer portions 84-1 to 84-3 to form a plurality of anode-cathode pairs 90, 92. Such deposition may be performed by conventional metallization techniques.

Figure 6D:
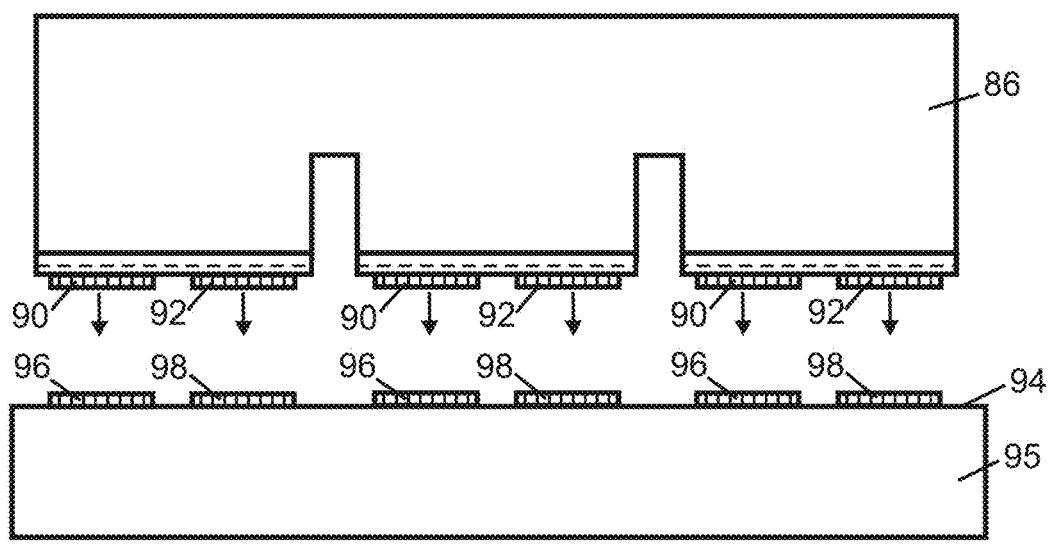
Figure 6E:
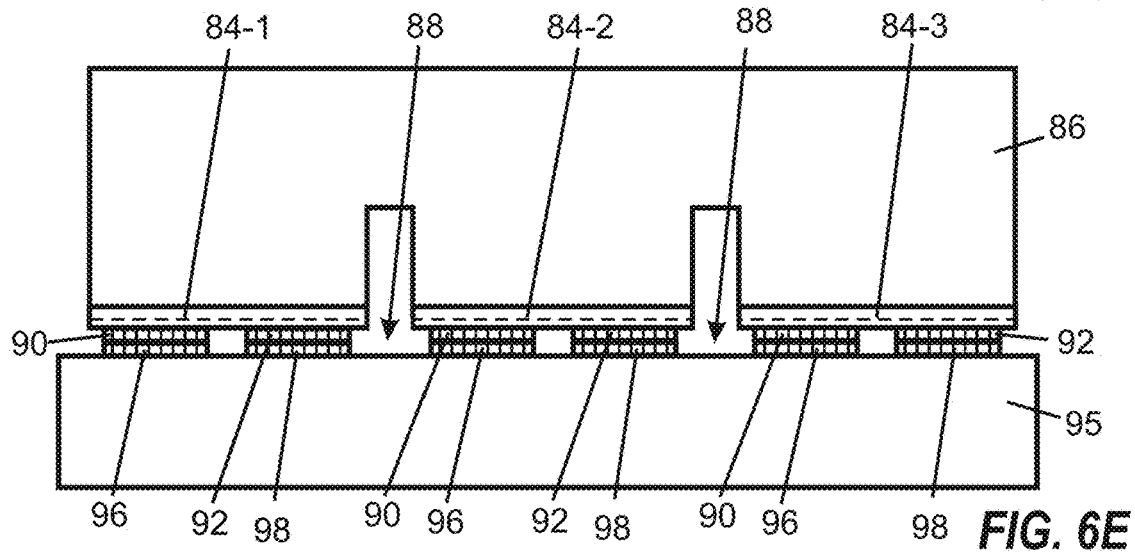

In FIG. 6D and FIG. 6E, the substrate 86 is flip-chip mounted over a mounting surface 94. In some embodiments, the mounting surface 94 is a surface of a submount 95 that includes a plurality of electrode pairs 96, 98. The submount 95 may comprise an active interface element such as an ASIC chip, a passive interface element that serves as an intermediate element that may be later-attached to an active interface element, or a temporary interface element that provides temporary support for subsequent manufacturing steps. For embodiments in which the submount 95 comprises a temporary interface element, the plurality of electrode pairs 96, 98 may be omitted. The flip-chip mounting comprises establishing electrically conductive paths between the plurality of anode-cathode pairs 90, 92 and the plurality of electrode pairs 96, 98. In some embodiments, the plurality of anode-cathode pairs 90, 92 are planarized before flip-chip mounting to correct any variations in thicknesses from the anode-cathode deposition. Such planarization helps ensure that reliable electrical contacts may be made across the electrode pairs 96, 98 distributed across the entire interface between the submount 95 and the substrate 86, and avoids variation in interfacial height that would otherwise promote cracking of the substrate 86 when the substrate 86 is mechanically processed (e.g., thinned and shaped) in subsequent steps. The submount 95 may include a plurality of separate electrical paths, including one electrical path for each electrode pair of the plurality of electrode pairs 96, 98. In this regard, each of the active layer portions 84-1 to 84-3 may be independently electrically accessible. Additionally, this allows a group or subgroup of the active layer portions (e.g., 84-1 and 84-2) to be accessed together, independently of other active layer portions (e.g., 84-3). Any suitable material and/or technique (e.g., solder attachment, preform attachment, flux or no-flux eutectic attachment, silicone epoxy attachment, metal epoxy attachment, thermal compression attachment, bump bonding, and/or combinations thereof) can electrically connect the plurality of anode-cathode pairs 90, 92 and the plurality of electrode pairs 96, 98. In some embodiments, residue from the mounting step may be left in undesired areas between the substrate 86 and the submount 95 (such as in the recesses or streets 88), and a cleaning step (such as an ultrasonic clean), may be used to remove the residue.

Figure 6F:
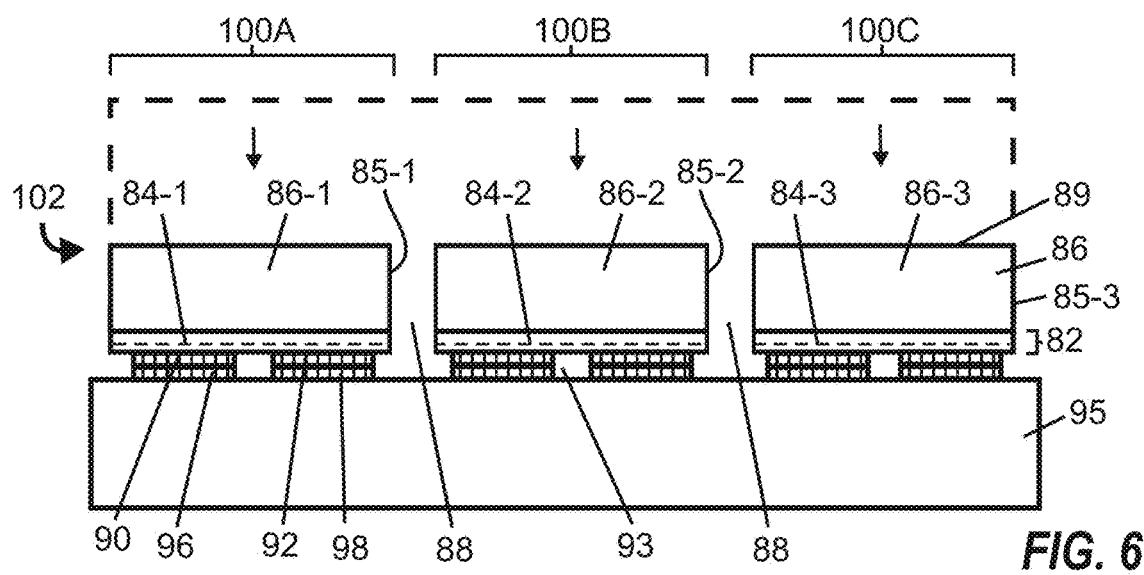

In FIG. 6F, the substrate 86 is subjected to one or more thinning processes to thin an entire upper portion of the substrate 86, in order to create openings into the streets 88. In certain embodiments, the thinning comprises grinding at a slow rate (e.g., at a thickness removal rate of 0.1 μm per second for a SiC substrate). Other thinning processes such as grinding, lapping, and mechanical polishing may be additionally or alternatively be used. In certain embodiments, the substrate 86 may initially comprise a thickness of greater than 300 μm. After mounting the substrate 86 to the submount 95, the substrate 86 may be thinned to a thickness of no more than 170 μm, no more than 150 μm, no more than 120 μm, or no more than 100 μm. In some embodiments, the substrate 86 may be thinned to about 50 μm, about 30 μm, about 15 μm, or about 10 μm, by one or more thinning steps.

A desirable substrate thickness may depend in part on the substrate material. Sapphire is less brittle than silicon carbide, such that a desirable sapphire substrate thickness may be greater (e.g., in a range of 100 μm to 170 μm) than a desirable thickness of a silicon carbide substrate (e.g., in a range of 15 μm to 120 μm, or a suitable subrange thereof). Generally, a thinner substrate 86 may confer better optical properties to a resulting light emitting device. The thinning process may be terminated when the thickness of the substrate 86 is less than or equal to the initial depth of the streets 88 so that openings into the streets 88 are formed, with an outer surface 89 of the substrate 86 serving as a light extraction surface. The substrate 86 is thereby segregated into a plurality of discontinuous substrate portions 86-1 to 86-3 that are registered with corresponding active layer portions 84-1 to 84-3 to form a pixelated-LED chip 102 comprising a plurality of pixels 100A, 100B, and 100C. Each substrate portion 86-1 to 86-3 is bounded by a sidewall 85-1 to 85-3 of the corresponding pixel 100A-100C, with the sidewalls 85-1 to 85-3 forming lateral boundaries of the streets 88 (which embody inter-pixel spaces). Spaces 93 are also provided between the anode-cathode pairs 90, 92, as well as between the electrode pairs 96, 98, in an area between the active region 82 and a surface 94 of the submount 95. The streets 88 and the spaces 93 are subject to being filled with one or more underfill materials (e.g., including underfill material of composition that varies with depth), as described hereinafter.

FIGS. 7A-7E are schematic cross-sectional views of various states of fabrication of a pixelated-LED chip including steps of applying underfill materials into openings between pixels and application of a lumiphoric material. Descriptions of elements in FIGS. 6A-6F that correspond to correspondingly numbered elements shown in FIGS. 7A-7E may be omitted from the following discussion of FIGS. 7A-7E.

Figure 7A:
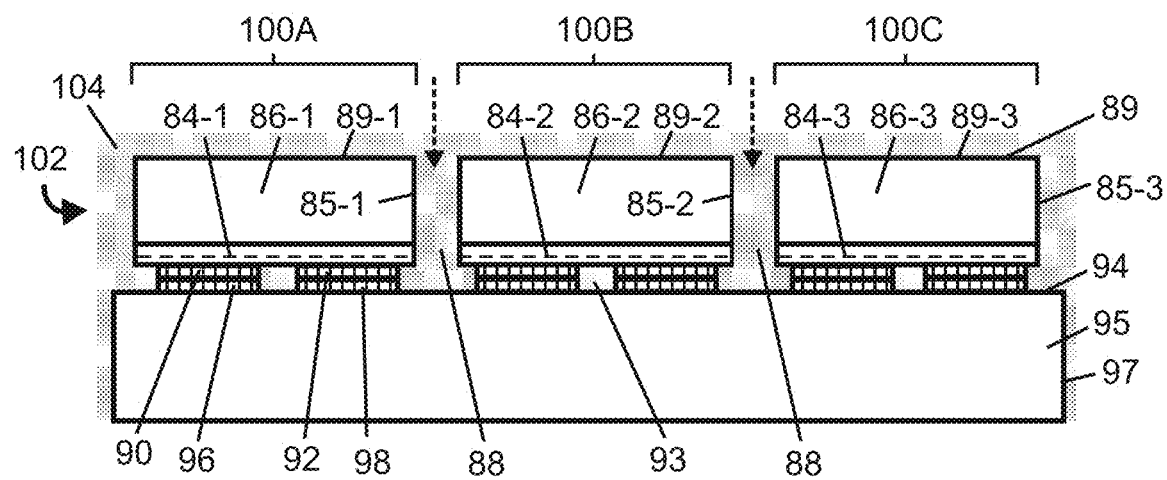
FIGS. 7A-7F are schematic cross-sectional views of various states of fabrication of a pixelated-LED chip including steps of applying underfill materials into openings between pixels and application of a lumiphoric material.

FIG. 7A illustrates the pixelated-LED chip 102 mounted over a submount 97 (as previously illustrated in FIG. 6F) following application of an underfill material 104 from a top side of the pixelated-LED chip 102 into the streets 88, as depicted by the dashed arrows. The pixelated-LED chip 102 includes active layer portions 84-1 to 84-2 and discontinuous substrate portions 86-1 to 86-3 with light extraction surfaces 89-1 to 89-3 that form multiple pixels 100A-100C. The underfill material 104 may be applied in a flowable form through the streets 88 to contact sidewalls 85-1 to 85-3 of the pixels 100A-100C, and to contact the anode-cathode pairs 90, 92 and electrode pairs 96, 98 as well as spaces 93 therebetween. The underfill material 104 may also contact an upper surface 94 (and optionally, sidewalls 97) of the submount 95. As shown, the underfill material 104 may overlap the light extraction surfaces 89-1 to 89-3 of the pixels 100A-100C.

In certain embodiments, the pixelated-LED chip 102 and underfill material 104 may be inserted into a pressure vessel (not shown) and subjected to elevated pressure conditions (e.g., clean dry air or nitrogen at a pressure within a range of 40 psi to 80 psi (2.76 bar to 5.52 bar), or within a range of 50 psi to 70 psi (3.45 bar to 4.83 bar) for several minutes in order to shrink any air bubbles initially present within the underfill material 104. This shrinkage of air bubbles may allow sidewalls 85-1 to 85-3 of the pixels 100A-100C to be more uniformly wetted with underfill material 104 supplied in a previous step. Optionally, the elevated pressure conditions may be provided in an autoclave (i.e., a heated pressure vessel, such as a pressurizable oven), whereby the underfill material 104 may be pressurized and thermally cured simultaneously. That is, elevated pressure conditions may be maintained while an autoclave containing the pixelated-LED chip 102 is heated in order to partially or fully cure the underfill material 104. Regardless of whether an autoclave or an unheated pressure vessel is used, after an elevated pressure condition is maintained for desired period (e.g., several minutes to an hour or more), the elevated pressure may be released slowly (by controlled release of pressure from the pressure vessel) and the pixelated-LED chip 102 may be removed from the pressure vessel. A controlled release of pressure from the pressure vessel may permit air, previously trapped as bubbles within silicone of the underfill material 104, to escape through interstitial spaces without exploding or otherwise tearing underfill material 104 away from the streets 88.

Figure 7B:
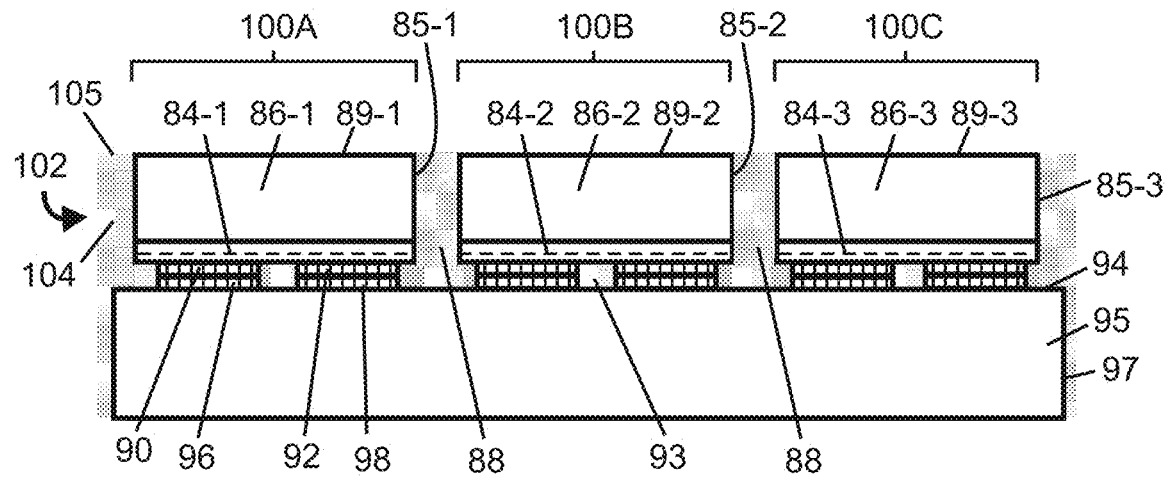

FIG. 7B shows the pixelated-LED chip 102 and submount 97 of FIG. 7A following removal of an excess upper portion of underfill material 104 in order to expose the light extraction surfaces 89-1 to 89-3 of the pixels 100A-100C. In certain embodiments, the underfill material 104 is applied in a flowable form, and an excess upper portion of the underfill material 104 is removed by wiping with a cleanroom cloth, such as a woven nylon cloth (e.g., commercially available from Texwipe, Kernersville, N.C., USA). As shown in FIG. 7B, in certain embodiments, removal of an excess upper portion of the underfill material 104 may yield an upper surface 105 of the underfill material 104 that is substantially flush (coplanar) with the light extraction surfaces 89-1 to 89-3 of the pixels 100A-100C. If desired, the underfill material 104 may be cured in this configuration by suitable curing methods such as photonic, thermal, and/or chemical means, optionally while the pixelated-LED chip 102 is subjected to an elevated pressure condition in a suitable pressure vessel. However, an initial application of underfill material 104 to the pixelated-LED chip 102 may not be sufficient to fully and uniformly fill all of the streets 88 with underfill material 104, and in such a condition, non-uniform optical and mechanical performance may result.

Figure 7C:
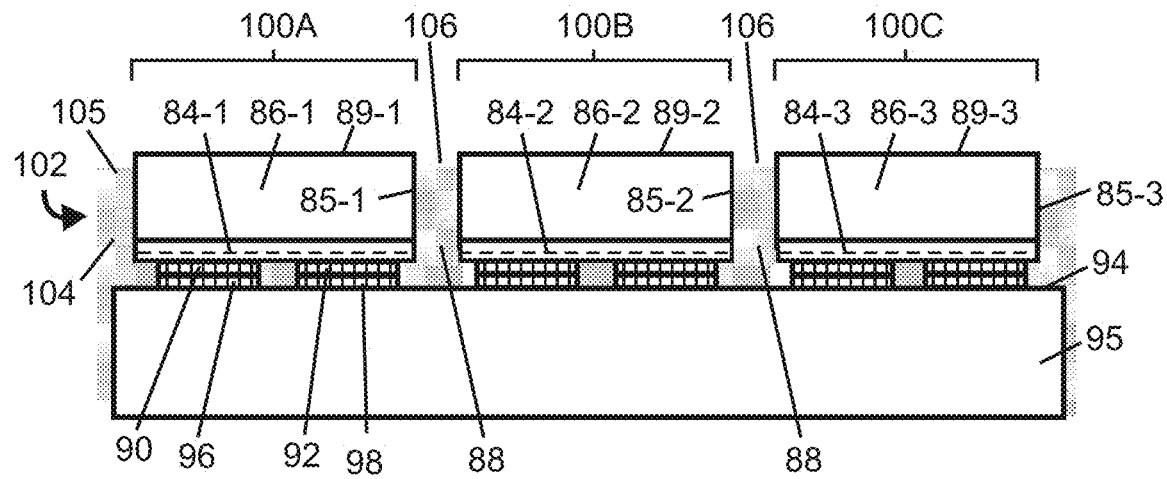

Referring to FIG. 7C, in certain embodiments, removal of an excess upper portion of the underfill material 104 (e.g., by wiping if the underfill material 104 is uncured) may cause an upper surface 105 of underfill material 104 to be recessed relative to light extraction surfaces 89-1 to 89-3 of the pixels 100A-100C to form underfill recesses 106. As an alternative to wiping, underfill recesses 106 may be formed by selectively removing an upper portion of underfill by mechanical means, such as scraping, saw cutting, or the like, wherein such selective removal steps may optionally be preceded by curing the underfill material 104. Regardless of how the underfill recesses 106 are formed, a majority of a height of sidewalls 85-1 to 85-3 of the pixels 100A-100C preferably remains covered by (i.e., in contact with) the underfill material 104. In certain embodiments, each discontinuous substrate portion 86-1 to 86-3 may have a height in a range of from 25 µm to 50 µm, and each underfill recess 106 may have a depth in a range of from 2 µm to 8 µm, or about 4 µm to 6 µm.

After the first underfill material 104 is supplied to the streets 88, optionally subjected to an elevated pressure condition, and any excess first underfill material 104 is wiped, in certain embodiments a pixelated-LED chip 102 such as shown in FIG. 7C may be placed in a vacuum chamber (not shown) and subjected to a subatmospheric pressure condition (e.g., in a range of 1 mBar to 20 mBar, or in a range of 5 mBar to 15 mBar, or in a range of 8 mBar to 12 mBar) for several minutes (e.g., 5-15 minutes) to promote removal of air bubbles from the first underfill material 104. After a subatmospheric pressure condition is maintained for several minutes, the vacuum chamber may be slowly vented (i.e., by controlled admission of gas, such as atmospheric air, into the vacuum chamber) to return the chamber to atmospheric condition, and the pixelated-LED chip 102 may be removed for further processing.

Figure 7D:
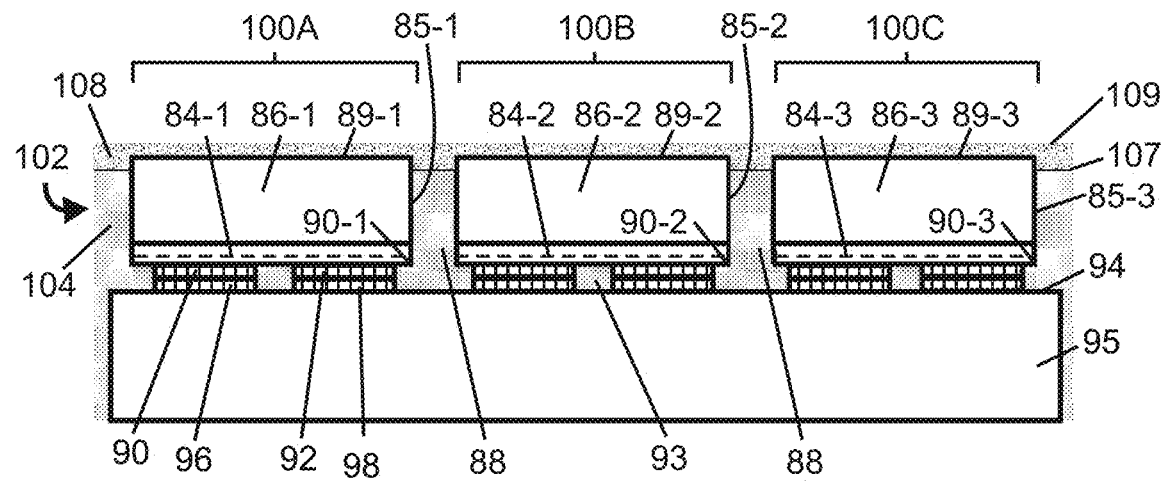

FIG. 7D shows the assembly of FIG. 7C following addition of a second underfill material 108 over the previously-applied underfill material 104 (which may be termed a first underfill material), with the second underfill material 108 extending over light extraction surfaces 89-1 to 89-3 of the pixels 100A-100C, filling the underfill recesses 106 (as previously shown in FIG. 7C), and forming an interface 107 with the first underfill material 104. The second underfill material 108 may differ in composition and/or concentration with respect to one or more constituents of the first underfill material 104. In certain embodiments, the second underfill material 108 comprises a higher concentration of particulate material (e.g., titanium dioxide and/or fumed silica) than the first underfill material 104. In certain embodiments, the second underfill material 108 may be applied in multiple steps, including sequential applications of underfill in flowable form and dry form, respectively. Due to the second underfill material 108 occupying space previously defined by the underfill recesses 106, sidewalls 85-1 to 85-3 of the pixels are in contact with underfill that varies in composition with depth. In particular, underfill material 104 of a first composition is provided proximate to lower boundaries 90-1 to 90-3 of the pixels 100A-100C, and underfill material 108 of a second composition is provided proximate to upper boundaries (i.e., light extraction surfaces 89-1 to 89-3) of the pixels 100A-100C.

Figure 7E:
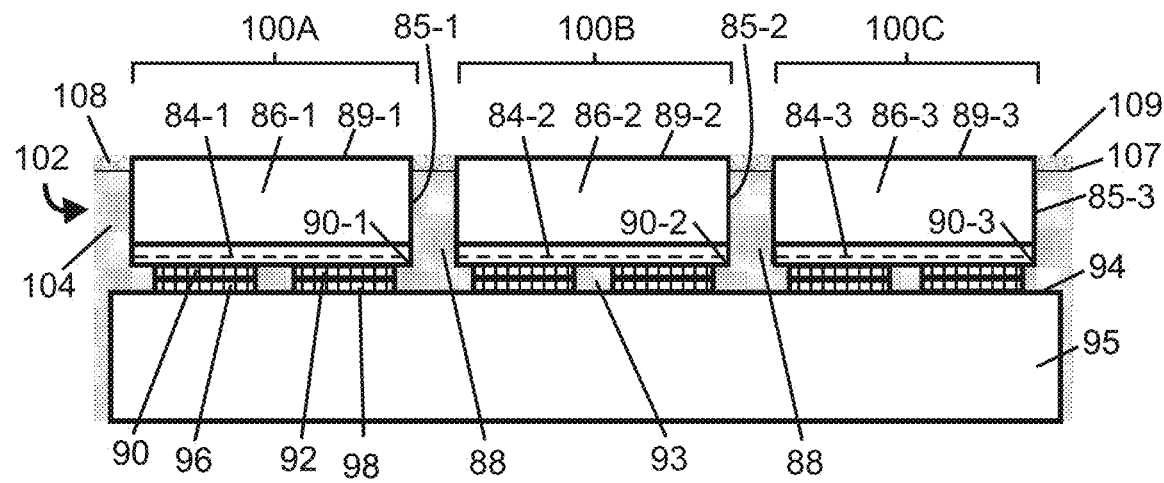

Referring to FIG. 7E, excess second underfill material 108 may be removed (e.g., by wiping, grinding, or other means) from light extraction surfaces 89-1 to 89-3 of the pixels 100A-100C. Such removal may cause an upper surface 109 of the second underfill material 108 to be substantially flush (i.e., coplanar) with the light extraction surfaces 89-1 to 89-3. In certain embodiments, the second underfill material 108 may be applied and excess material removed multiple times, and the second underfill material 108 may be applied in flowable and/or dry form. In certain embodiments, the second underfill material 108 may be cured (e.g., solidified) by any appropriate means (e.g., thermal, photonic, chemical, or the like). In certain embodiments, the second underfill material 108 provides different light-affecting properties (e.g., scattering, reflecting, absorbing) than the first underfill material 104, which may affect (e.g., enhance) segregation of emissions of different pixels 100A-100C and therefore allow contrast of the pixelated-LED chip 102 to be enhanced.

Figure 7F:
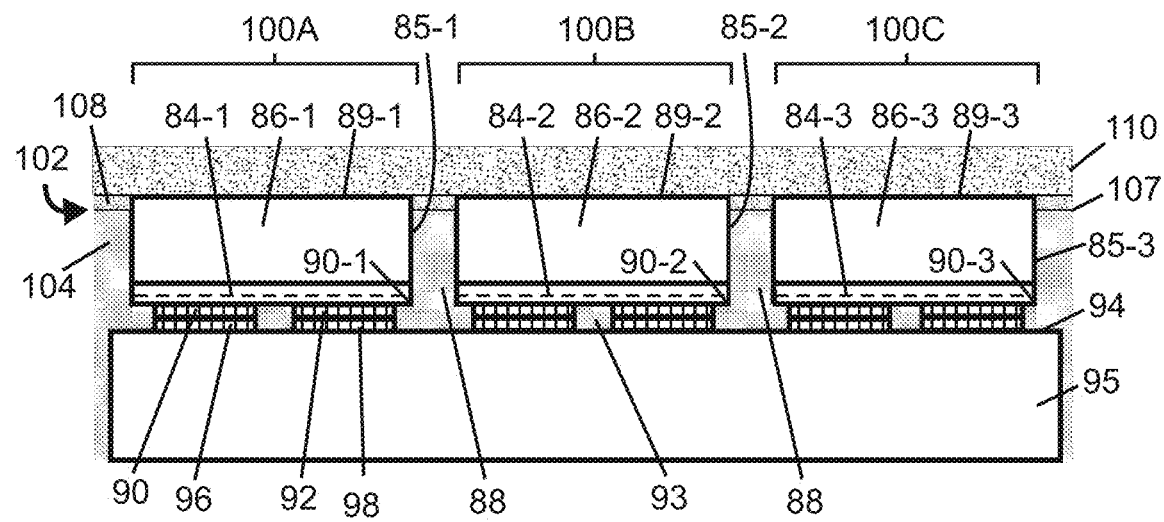

FIG. 7F shows the pixelated-LED chip 102 and submount 95 assembly of FIG. 7E following application of a lumiphoric material 110 over the pixelated-LED chip 102. As shown, the lumiphoric material 110 may be arranged in contact with light extraction surfaces 89-1 to 89-3 of the pixels 100A-100C and with the second underfill material 108. In certain embodiments, the lumiphoric material 110 may be applied in a flowable form and subsequently cured. In certain embodiments, the lumiphoric material 110 may be provided in solid form (e.g., a film, a predefined substrate, etc.). Because the light extraction surfaces 89-1 to 89-3 are devoid of macrotextural features, and are substantially flat and flush with the second underfill material 108, the layer of lumiphoric material 110 applied thereover may have a uniform thickness, such as with a thickness variation of less than 500 nm over an entire thickness of all light extraction surfaces 89-1 to 89-3, thereby promoting uniform light emissions from all areas of the pixelated-LED chip 102.

Figure 8A:
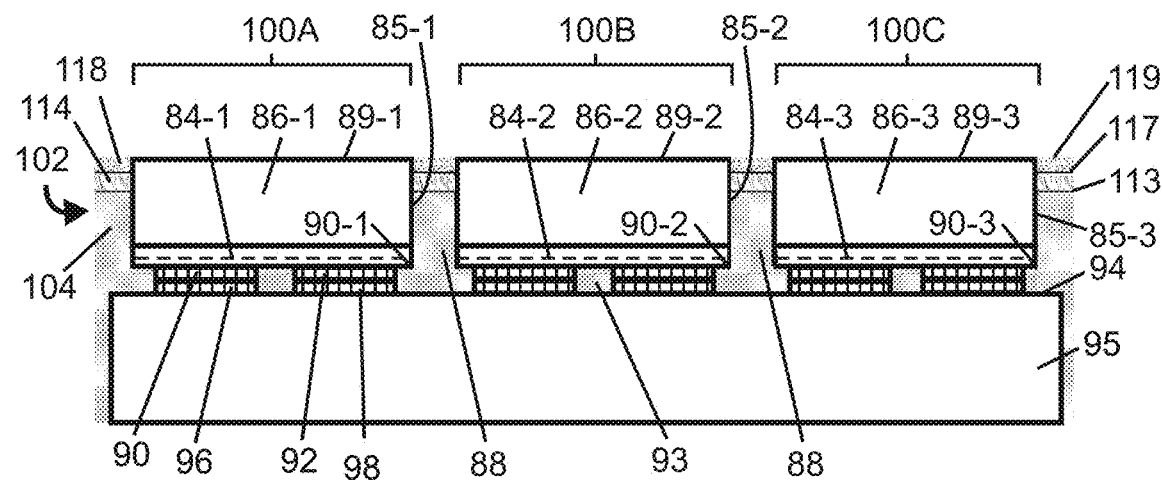
FIGS. 8A and 8B are schematic cross-sectional views of states of fabrication of a pixelated-LED chip that includes multiple underfill material layers and application of a lumiphoric material.
Figure 8B:
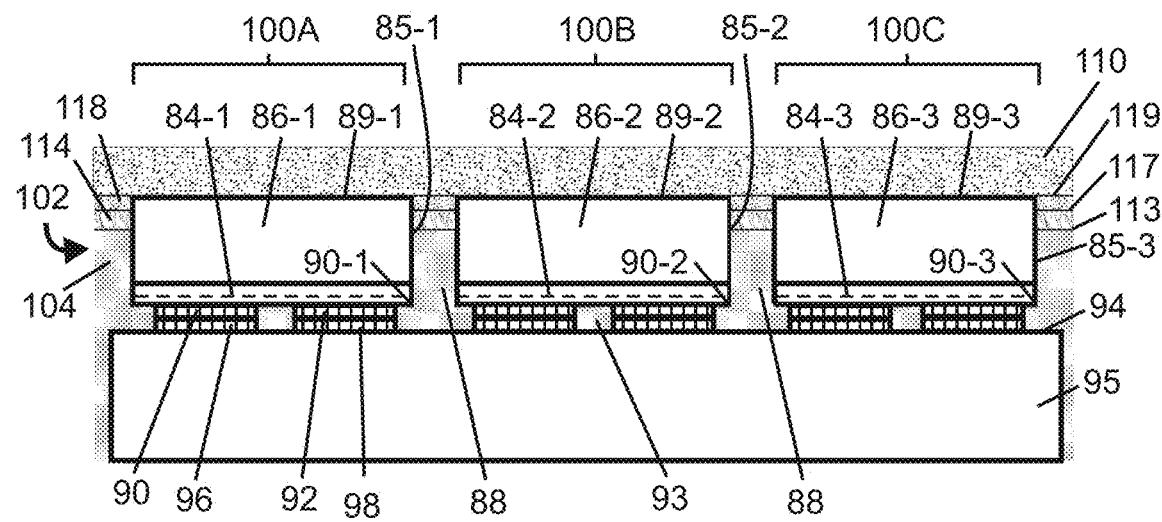

FIGS. 8A and 8B are schematic cross-sectional views of various states of fabrication of a pixelated-LED chip that includes multiple underfill material layers between pixels and application of a lumiphoric material. Underfill material layers of any suitable thickness may be provided. Descriptions of elements in FIGS. 8A-6F that correspond to correspondingly numbered elements shown in FIGS. 6A-6F and FIGS. 7A-7E may be omitted from the following discussion of FIGS. 8A and 8B.

FIG. 8A illustrates the pixelated-LED chip 102 mounted over a submount 97 (as previously illustrated in FIG. 6F) following sequential application of multiple underfill material layers 104, 114, 118 from a top side of the pixelated-LED chip 102 into the streets 88. The pixelated-LED chip 102 includes active layer portions 84-1 to 84-2 and discontinuous substrate portions 86-1 to 86-3 with light extraction surfaces 89-1 to 89-3 that form multiple pixels 100A-100C. A first interface 113 is provided between first and second underfill material layers 104, 114, and a second interface 117 is provided between second and third underfill material layers 114, 118, with both interfaces 113, 117 arranged below a level of the light extraction surfaces 89-1 to 89-3 of the pixels 100A-100C. A first underfill material 104 may be applied in a flowable form through the streets 88 to contact sidewalls 85-1 to 85-3 of the pixels 100A-100C, to contact the anode-cathode pairs 90, 92 and electrode pairs 96, 98 as well as spaces 93 therebetween, and to contact an upper surface 94 (and optionally, sidewalls 97) of the submount 95. In certain embodiments, the first underfill material 104 may be supplied to a level (e.g., height) that does not reach the light extraction surfaces 89-1 to 89-3. In other embodiments, the first underfill material 104 may be supplied to a level that is at or above the light extraction surfaces 89-1 to 89-3, and an upper portion of the first underfill material 104 may be removed (e.g., by wiping, scraping, or other methods disclosed herein) to provide space for application of the second and third underfill material layers 114, 118. Optionally, the first underfill material 104 may be partially or fully cured before application of the second underfill material layer 114. The second underfill material layer 114 may be applied through the streets 88 to contact the first underfill material layer 104 at the first interface 113. If the second underfill material layer 114 is supplied to the streets 88 to a level that is at or above the light extraction surfaces 89-1 to 89-3, then an upper portion of the second underfill material layer 114 may be removed to provide space for application of the third underfill material layer 118. As shown, an upper surface 119 of the third underfill material layer 118 may be substantially coplanar with the light extraction surfaces 89-1 to 89-3 of the pixels 100A-100C. The first, second, and third underfill material layers 114 contact the sidewalls 85-1 to 85-3 of the pixels 100A-100C. The first, second, and third underfill material layers 114 may be compositionally different, such as by varying the presence and/or composition of binding materials and/or various particulate material dispersed therein, such as disclosed hereinabove. In certain embodiments, the first to third underfill material layers 104, 114, 118 may be partially or fully cured, whether sequentially or simultaneously, after application.

FIG. 8B shows the pixelated-LED chip 102 and submount 95 assembly of FIG. 8A following application of a lumiphoric material 110 over the pixelated-LED chip 102. As shown, the lumiphoric material 110 may be arranged in contact with light extraction surfaces 89-1 to 89-3 of the pixels 100A-100C and with an upper surface 119 of the third underfill material 118. In certain embodiments, the lumiphoric material 110 may be applied in a flowable form and subsequently cured. In certain embodiments, the lumiphoric material 110 may be provided in solid form (e.g., a film, a predefined substrate, etc.).

Although various embodiments herein illustrate and describe discrete underfill material layers, it is to be appreciated that in certain embodiments, underfill material may have a gradient composition, with the composition varying in a substantially continuous manner in a vertical direction. Such a gradient may be produced, for example, by altering composition of an underfill material as it is being dispensed or otherwise supplied into streets between pixels of a pixelated-LED chip.

Figure 9:
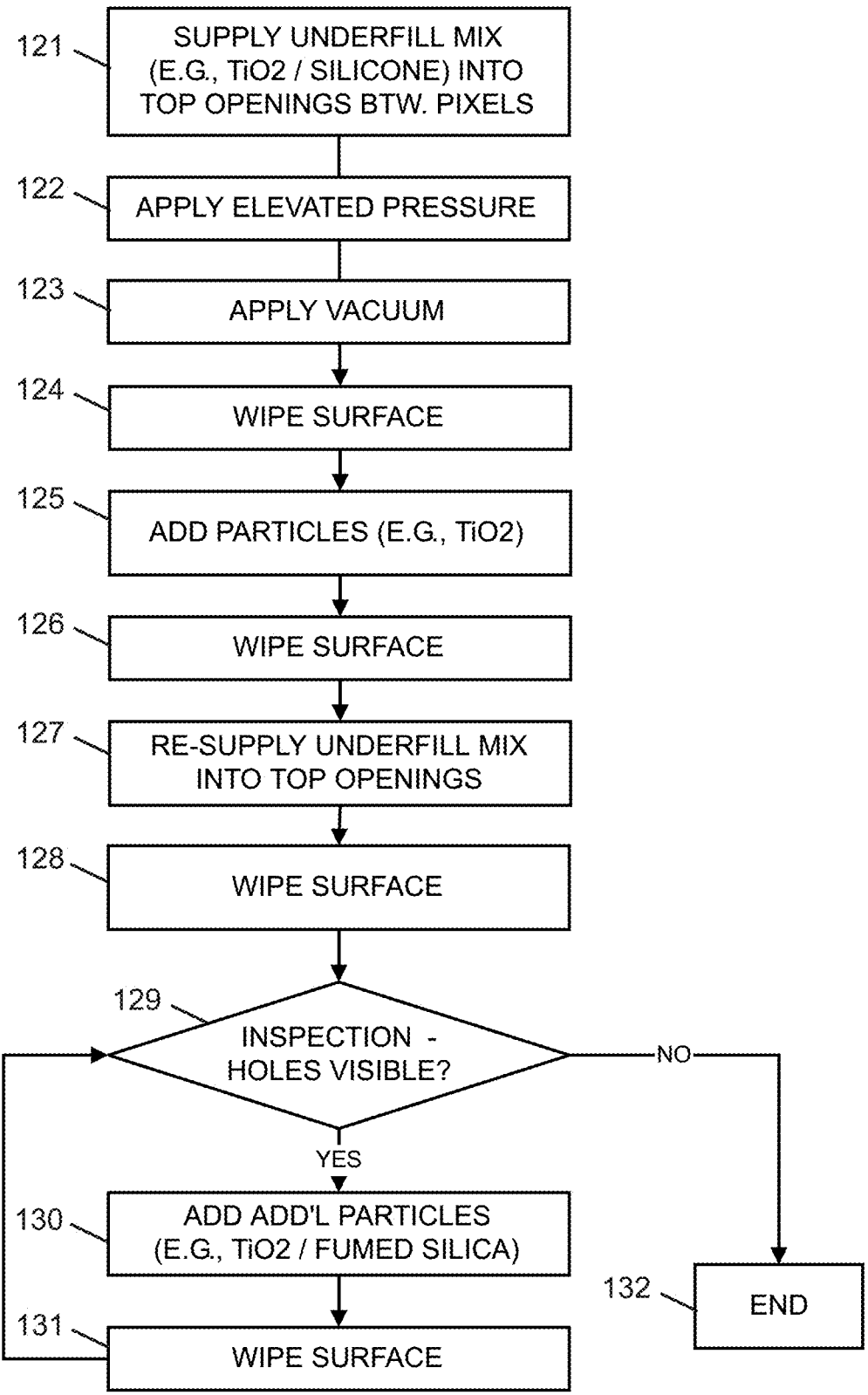
FIG. 9 is a flowchart identifying steps of a method including application of underfill material to a pixelated-LED chip into openings between pixels.

FIG. 9 is a flowchart identifying steps of a method including application of underfill material to a pixelated-LED chip into openings between pixels. A first step 121 includes supplying an underfill mix (e.g., particulate material in a binder, such as titanium dioxide particles in silicone, which may be flowable) into top openings (e.g., into streets) between pixels of a pixelated-LED chip. Optionally, a second step 122 includes subjecting the pixelated-LED chip and the underfill material to an elevated pressure condition in a pressure vessel, followed by controlled release of pressure from the pressure vessel. Optionally, a third step 123 includes subjecting the pixelated-LED chip and the underfill material to a subatmospheric pressure condition in a vacuum chamber, followed by controlled admission of gas into the vacuum chamber. A fourth step 124 includes wiping a surface of the pixelated-LED chip to remove excess portions of the underfill mix. Optionally, such removal may also form underfill recesses. A fifth step 125 includes adding particles (e.g., titanium dioxide) in dry form to the openings (e.g., streets) between pixels of the pixelated-LED chip. A sixth step 126 includes wiping a surface of the pixelated-LED chip to remove excess particles that were applied during the fifth step. A seventh step 127 includes re-supplying an underfill mix (e.g., particulate material in a binder, such as titanium dioxide particles in silicone, which may be flowable) into top openings between pixels. The underfill mix in the seventh step 127 may be different from, or the same as, the underfill mix used in the first step 121. An eighth step 128 includes wiping a surface of the pixelated-LED chip to remove excess underfill material provided in the seventh step. A ninth step 129 includes inspecting (e.g., optically inspecting) the pixelated-LED chip to assess any voids or non-uniformities are present among underfill material in the streets thereof. If any voids or irregularities are present, then a tenth step 130 includes addition of further particles (e.g., titanium dioxide and/or fumed silica), followed by an eleventh step 131 of wiping a surface of the pixelated LED chip to remove excess particulate material, followed by a return to the ninth step 129 to perform further inspection. The ninth through eleventh steps 129-131 may be repeated as necessary until inspection (according to step 129) does not reveal any further holes or irregularities, at which point the method ends at step 132. Further steps (not shown) may include addition of lumiphoric material over surfaces of the pixelated LED chip and underfill material thereof.

Consistent with the steps described in connection with FIG. 8, in certain embodiments, underfill may be applied to a pixelated LED chip by applying a first underfill material embodying a flowable underfill mix (including titanium dioxide particles in a silicone binder) downward through openings into streets of the pixelated LED chip (e.g., to substantially fill the streets as well as spaces between anodes and cathodes thereof), followed by wiping excess underfill material from an upper (e.g. light extraction) surface of the pixelated-LED chip. Such wiping may produce underfill recesses (or gaps) in upper portions of the streets. Thereafter, titanium dioxide particles (optionally in combination with fumed silica particles) may be added in dry form to the underfill recesses and pressed downward, followed by wiping to remove excess particles. Fumed silica particles may be much smaller than particles of titanium dioxide particles, and may act as a getter to promote inflow of a flowable binder material, which may be particularly beneficial in regions proximate to anode-cathode pairs that may have residue (e.g., adhesive) from prior processing steps that may locally affect surface tension properties of surfaces. The dry particle application step may be followed by re-application of an underfill mix (e.g., titanium dioxide particles suspended in silicone) over and into the streets, followed by wiping. The pixelated LED chip may be optically inspected for voids or irregularities in the underfill applied to the streets. Thereafter, additional particulate material (e.g., titanium dioxide and/or fumed silica) may be applied to the streets, with excess wiped away. If voids or irregularities appear, additional particulate material may be applied, followed by wiping of excess material. Gentle wiping (e.g., performed with low contact pressure and/or over a short time) may reduce the likelihood of re-forming underfill recesses. Additionally particulate application and wiping steps may be performed if inspection reveals the presence of voids or irregularities in the underfill. When fumed silica particles smaller than titanium dioxide particles are used, it is also believed that fumed silica particles may help fill voids too large to be filled by individual titanium dioxide particles. If necessary or desired, the pixelated-LED chip and underfill material may be subjected to one or more curing steps (e.g., by application of heat, ultraviolet light, or curing chemicals) to solidify the binder component of the underfill. In certain embodiments, lumiphoric material may be applied over the pixelated-LED chip and one or more curing steps may be performed simultaneously on the lumiphoric material and underlying underfill material.

Those skilled in the art will recognize improvements and modifications to the preferred embodiments of the present disclosure. All such improvements and modifications are considered within the scope of the concepts disclosed herein and the claims that follow.

What is claimed is:

1. A pixelated-LED chip comprising:
    an active layer comprising a plurality of active layer portions;
    a substrate comprising a plurality of discontinuous substrate portions supporting the plurality of active layer portions, wherein each substrate portion comprises a light-transmissive material with a light extraction surface; and
    a plurality of anode-cathode pairs associated with the plurality of active layer portions;
    wherein each active layer portion of the plurality of active layer portions is configured to illuminate a different substrate portion of the plurality of discontinuous substrate portions and transmit light through the light extraction surface of the substrate portion, such that the plurality of active layer portions and the plurality of discontinuous substrate portions form a plurality of pixels;
    wherein an underfill material is arranged (i) between lateral sidewalls of the plurality of pixels and (ii) between the anode and the cathode of each pixel of the plurality of pixels;
    wherein lateral sidewalls of plurality of pixels comprise a lower boundary proximate to the plurality of anode-cathode pairs, and comprise an upper boundary proximate to the light extraction surface of each substrate portion;
    wherein the underfill material comprises a first composition proximate to the lower boundary, the underfill material comprises a second composition proximate to the upper boundary, and the second composition differs from the first composition.

2. The pixelated-LED chip of claim 1, comprising at least one of the following features:
    (i) the underfill material comprises a total thickness in a range of 15 μm to 200 μm;
    (ii) the first composition is provided in a first layer that comprises a first thickness, the second composition is provided in a second layer that comprises a second thickness, and a ratio of the first thickness to the second thickness is in a range of from 1:1 to 20:1;
    (iii) the first composition is provided in a first layer that comprises one of an optically reflective underfill layer, an optical scattering underfill layer, a light-absorptive underfill layer, a selectively light reflective underfill layer, a selectively light absorptive underfill layer, a light filtering underfill layer, or an etch-resistant underfill layer; and the second composition is provided in a second layer that comprises a different one of an optically reflective underfill layer, an optical scattering underfill layer, a light-absorptive underfill layer, a selectively light reflective underfill layer, a selectively light absorptive underfill layer, a light filtering underfill layer, or an etch-resistant underfill layer;
    (iv) the underfill material comprises particulate material and a binder present in a weight percent ratio of particulate material to binder in a range of from 1:1 to 10:1.

3. The pixelated-LED chip of claim 1, wherein the underfill material comprises silicone and a metallic oxide.

4. The pixelated-LED chip of claim 3, wherein the second composition comprises a greater concentration of metallic oxide than the first composition.

5. The pixelated-LED chip of claim 3, wherein the second composition comprises silica, and the second composition comprises a greater concentration of silica than the first composition.

6. The pixelated-LED chip of claim 1, comprising a gradient transition of material composition between (i) the first composition proximate to the lower boundary and (ii) the second composition proximate to the upper boundary.

7. The pixelated-LED chip of claim 1, further comprising at least one lumiphoric material arranged on or over the light extraction surface and in contact with the underfill material, wherein the at least one lumiphoric material is configured to receive at least a portion of light emitted by the plurality of active layer portions and to responsively generate lumiphor emissions.

8. The pixelated-LED chip of claim 7, wherein the at least one lumiphoric material is continuous on the plurality of pixels.

9. The pixelated-LED chip of claim 7, wherein the at least one lumiphoric material comprises a thickness variation of less than 500 nm over an entirety of the light extraction surface.

10. The pixelated-LED chip of claim 1, wherein the light extraction surface comprises a non-repeating irregular textural pattern.

11. A pixelated-LED chip comprising:
an active layer comprising a plurality of active layer portions;
a substrate comprising a plurality of discontinuous substrate portions supporting the plurality of active layer portions, wherein each substrate portion comprises a light-transmissive material with a light extraction surface; and
a plurality of anode-cathode pairs associated with the plurality of active layer portions;
wherein each active layer portion of the plurality of active layer portions is configured to illuminate a different substrate portion of the plurality of discontinuous substrate portions and transmit light through the light extraction surface of the substrate portion, such that the plurality of active layer portions and the plurality of discontinuous substrate portions form a plurality of pixels; and
wherein a plurality of underfill material layers is arranged (i) between lateral sidewalls of the plurality of pixels and (ii) between the anode and the cathode of each pixel of the plurality of pixels, with each underfill material layer of the plurality of underfill material layers being compositionally different relative to each adjacent underfill material layer of the plurality of underfill material layers.

12. The pixelated-LED chip of claim 11, wherein:
a first underfill material layer of the plurality of underfill material layers comprises one of an optically reflective underfill layer, an optical scattering underfill layer, a light-absorptive underfill layer, a selectively light reflective underfill layer, a selectively light absorptive underfill layer, a light filtering underfill layer, or an etch-resistant underfill layer; and
a second underfill material layer of the plurality of underfill material layers comprises a different one of an optically reflective underfill layer, an optical scattering underfill layer, a light-absorptive underfill layer, a selectively light reflective underfill layer, a selectively light absorptive underfill layer, a light filtering underfill layer, or an etch-resistant underfill layer.

13. The pixelated-LED chip of claim 11, comprising at least one of the following features:

(i) the plurality of underfill material layers comprises a total thickness in a range of 15 µm to 200 µm;
(ii) the plurality of underfill material layers comprises a first underfill material layer and a second underfill material layer, and a ratio of the first thickness to the second thickness is in a range of from 1:1 to 20:1; and
(iii) the plurality of underfill material layers comprises a first underfill material layer and a second underfill material layer, and each of the first and the second underfill material layers comprises particulate material and a binder present in a weight percent ratio of particulate material to binder in a range of from 1:1 to 10:1.

14. The pixelated-LED chip of claim 11, wherein one or more underfill material layers of the plurality of underfill material layers comprises silicone and particulate material comprising at least one metallic oxide.

15. The pixelated-LED chip of claim 14, wherein one underfill material layer of the plurality of underfill material layers comprises a greater concentration of metallic oxide than another underfill material layer of the plurality of underfill material layers.

16. The pixelated-LED chip of claim 14, wherein one underfill material layer of the plurality of underfill material layers comprises a greater concentration of silica than another underfill material layer of the plurality of underfill material layers.

17. The pixelated-LED chip of claim 11, further comprising at least one lumiphoric material arranged on or over the light extraction surface and in contact with the underfill material, wherein the at least one lumiphoric material is configured to receive at least a portion of light emitted by the plurality of active layer portions and to responsively generate lumiphor emissions.

18. The pixelated-LED chip of claim 17, wherein the at least one lumiphoric material is continuous on the plurality of pixels.

19. The pixelated-LED chip of claim 17, wherein the at least one lumiphoric material comprises a thickness variation of less than 500 nm over an entirety of the light extraction surface.

20. The pixelated-LED chip of claim 11, wherein the light extraction surface comprises a non-repeating irregular textural pattern.

* * * * *